(12) United States Patent
Grandi

(10) Patent No.: US 12,080,631 B2
(45) Date of Patent: Sep. 3, 2024

(54) LEADFRAME-LESS LASER DIRECT STRUCTURING (LDS) PACKAGE

(71) Applicant: STMICROELECTRONICS S.r.l., Agrate Brianza (IT)

(72) Inventor: Luca Grandi, Mantova (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 170 days.

(21) Appl. No.: 17/463,140

(22) Filed: Aug. 31, 2021

(65) Prior Publication Data
US 2023/0067918 A1 Mar. 2, 2023

(51) Int. Cl.
*H01L 23/485* (2006.01)
*H01L 21/56* (2006.01)
*H01L 23/31* (2006.01)

(52) U.S. Cl.
CPC .......... *H01L 23/485* (2013.01); *H01L 21/561* (2013.01); *H01L 23/3107* (2013.01)

(58) Field of Classification Search
None
See application file for complete search history.

(56) References Cited

U.S. PATENT DOCUMENTS

| | | | |
|---|---|---|---|
| 8,772,087 B2 | 7/2014 | Barth et al. | |
| 10,211,071 B2 | 2/2019 | Ho et al. | |
| 10,535,535 B2 | 1/2020 | Marchisi | |
| 2013/0069222 A1* | 3/2013 | Camacho | H01L 24/19 257/737 |
| 2015/0279778 A1* | 10/2015 | Camacho | H01L 21/4846 257/737 |
| 2016/0351516 A1* | 12/2016 | Karlovsky | H01L 24/03 |
| 2019/0115287 A1* | 4/2019 | Derai | H01L 24/73 |
| 2019/0259629 A1* | 8/2019 | Ziglioli | H01L 21/4821 |
| 2020/0321274 A1 | 10/2020 | Magni | |
| 2020/0381380 A1 | 12/2020 | Lee et al. | |
| 2021/0050299 A1 | 2/2021 | Ziglioli et al. | |

\* cited by examiner

*Primary Examiner* — Jay C Chang
(74) *Attorney, Agent, or Firm* — Seed IP Law Group LLP

(57) ABSTRACT

The present disclosure is directed to a semiconductor package including a first laser direct structuring (LDS) resin layer and a second LDS resin layer on the first LDS resin layer. Respective surfaces of the first LDS resin layer and the second LDS resin layer are patterned utilizing an LDS process by exposing the respective surfaces to a laser. Patterning the first and second LDS resin layers, respectively, activates additive material present within the first and second LDS resin layers, respectively, converting the additive material from a non-conductive state to a conductive state. The LDS process is followed by a chemical plating step and an electrolytic plating process to form conductive structure coupled to a plurality of die within the first and second LDS resin layers. A molding compound layer is formed on surfaces of the conductive structures and covers the surfaces of the conductive structures. After these steps have been completed, the first LDS resin layer and the second LDS resin layer are singulated along channels filled with conductive material.

19 Claims, 20 Drawing Sheets

… (US 12,080,631 B2)

LEADFRAME-LESS LASER DIRECT STRUCTURING (LDS) PACKAGE

BACKGROUND

Technical Field

The present disclosure is directed to a leadframe-less semiconductor package, and a method of utilizing laser direct structuring (LDS) to form a leadframe-less semiconductor package.

Description of the Related Art

Generally, methods of forming conventional semiconductor packages include utilizing a leadframe to form conductive components (e.g., bus bars, die pads, leads, etc.) within the conventional semiconductor packages. For example, conventional semiconductor packages may be formed by coupling a plurality of semiconductor die to die pad portions (e.g., portions that will become die pads of singulated ones of the conventional semiconductor packages) of the leadframe. After coupling the plurality of die to the die pad portions, a plurality of electrical wires may be formed by a bond and stitch technique to couple contact pads at respective active surfaces of the plurality of die to respective ones of a plurality of lead portions (e.g., portions that will become leads of singulated ones of the conventional semiconductor packages) of the leadframe. After the electrical wires are formed, a molding compound may be formed utilizing a mold tool to cover the plurality of die, the plurality of leads, the plurality of die pads, and the plurality of electrical wires. The electrical wires may be embedded or encased with the molding compound. After forming the molding compound, the leadframe and the molding compound are singulated along saw lines (e.g., kerf lines) to form singulated (e.g., individual ones) of conventional semiconductor device packages.

In order to perform the method of formation of the conventional semiconductor packages as set forth above. A lead time for obtaining the leadframes for forming the conventional semiconductor packages may be lengthened due to a manufacturer having to wait for receipt of a shipment of the leadframes. For example, when the leadframes are obtained from a third party manufacturing, lead time for forming or manufacturing the conventional semiconductor packages may be increased resulting in fewer semiconductor packages being sold and shipped to customers.

As the method of forming the conventional semiconductor packages includes the leadframes, an overall thickness of the conventional semiconductor packages may be limited in being reduced as well. For example, the leadframes may be limited in being reduced in thickness as the leadframes need to be thick enough to avoid deformation while the leadframes are being handled during shipping and manufacturing. This limited reduction in thickness of the leadframes limits the amount thicknesses of conventional semiconductor packages may be reduced.

As the method of forming the conventional semiconductor packages includes forming the electrical wires, a clearance area between the leads and the die is provided such that the electrical wires may be formed to couple the die to the leads. Utilizing the electrical wires to form these electrical connections between the leads and the die may result in the overall thickness of the conventional semiconductor packages being limited such that the overall thickness may not be further reduced.

BRIEF SUMMARY

As the method of forming the conventional semiconductor packages includes the leadframes, an overall thickness of the conventional semiconductor packages may be limited in being reduced as well. For example, the leadframes may be limited in being reduced in thickness as the leadframes need to be thick enough to avoid deformation while the leadframes are being handled during shipping and manufacturing. This limited reduction in thickness of the leadframes limits the amount thicknesses of conventional semiconductor packages may be reduced such that the overall thicknesses of the conventional semiconductor packages are greater than the overall thicknesses of the leadframe-less semiconductor packages of the present disclosure.

The present disclosure is directed to forming leadframe-less semiconductor packages. In other words, the leadframe-less semiconductor packages are formed without utilizing a leadframe as the conventional semiconductor packages as discussed earlier. Instead, a laser direct structuring (LDS) process is utilized to form conductive structures within an embodiment of a semiconductor package of the present disclosure.

As the leadframe-less semiconductor packages of the present disclosure are formed without utilizing the leadframe, the lead times for manufacturing the leadframe-less semiconductor packages of the present disclosure may be reduced as compared to manufacturing the conventional semiconductor packages as discussed earlier as a manufacturer is not limited by obtaining leadframes from a third party supplier. As the leadframe-less semiconductor packages of the present disclosure do not include a leadframe, the leadframe-less semiconductor packages may be relatively thinner as compared to the conventional semiconductor packages that include a leadframe.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1A:
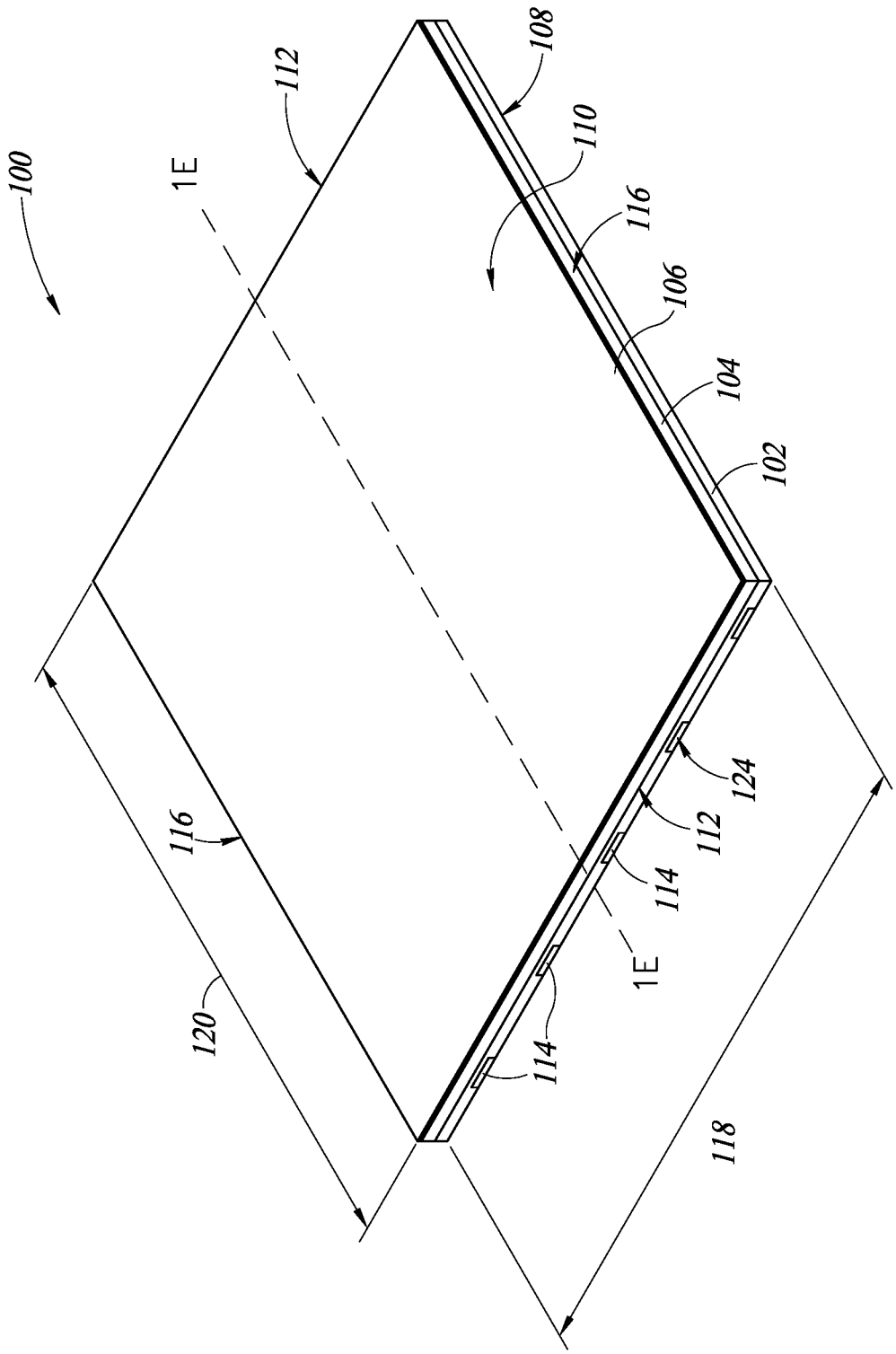
FIG. 1A illustrates a perspective view of an embodiment of a leadframe-less semiconductor package of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the Figures in the present disclosure as follows. These terms are not limiting as the possible positions explicitly disclosed, implicitly disclosed, or inherently disclosed in the present disclosure.

The term "substantially" is used to clarify that there may be slight differences and variation when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

While various embodiments are shown and described with respect to semiconductor die, it will be readily appreciated that embodiments of the present disclosure are not limited thereto. In various embodiments, the structures, devices, methods and the like described herein may be embodied in or otherwise utilized in any suitable type or form of semiconductor die, and may be manufactured utilizing any suitable semiconductor die and packaging technologies.

In at least one embodiment, a leadframe-less semiconductor package (e.g., leadframe-less semiconductor device package, leadframe-less integrated circuit package, leadframe-less semiconductor die package, etc.) includes a first layer including a first additive material and a second layer including a second additive material. In some embodiments, the first and second additive materials may be the same as each other whereas, in some other embodiments, the first and second additive materials may be different from each other. The first and second additive materials may be a non-conductive metallic compound that becomes conductive when exposed to a laser, for example, during a laser direct structuring (LDS) process. However, when the first and second non-conductive additive materials are exposed to a laser, the first and second additive materials are converted from a non-conductive state to a conductive state (e.g., converted from a non-conductive material to a conductive material). A die is on the first layer and is coupled to the first layer by an adhesive. Ones of a plurality of conductive structures extend through the first and second layers and ones of the plurality of conductive structures are coupled to contact pads of the die. Each one of the plurality of conductive structures includes multiple layers of conductive material. The conductive structures may include respective first ends that are coupled to respective ones of the contact pads of the die, and may include respective second ends that are exposed from the package such that electrical components external to the leadframe-less semiconductor package may be in electrical communication with the die. In other words, the plurality of conductive structures provides conductive pathways along which electrical signals may be sent to and from the die within the semiconductor package.

In at least one embodiment, a method of manufacturing the at least one embodiment of the leadframe-less semiconductor package of the present disclosure includes forming a wafer of a first LDS compatible resin includes the first additive material. The wafer includes a plurality of recesses separate and distinct from each other at locations at which ones of a plurality of die are to be coupled to the wafer. After forming the wafer, the plurality of die is coupled to the wafer at corresponding ones of the plurality of recesses. For example, an adhesive may be formed within each of the plurality of recesses, and, after forming the adhesive, a pick and place machine may place each one of the plurality of die onto the adhesive in a corresponding one of the plurality of recesses. After the plurality of die is coupled to the wafer by the adhesive, a second LDS compatible resin includes the second additive material is formed on the wafer and covers the plurality of die such that the plurality of die is sandwiched between the wafer and the second LDS compatible resin.

After forming the second LDS compatible resin, a laser direct structuring (LDS) process is performed forming (e.g., patterning) a plurality of first openings, a plurality of second openings, a plurality of troughs, a plurality of recesses, and a plurality of channels. Ones of the plurality of first openings extend into the second LDS compatible resin to corresponding ones of the contact pads of the die. Ones of the plurality of second openings extend entirely through the layer of the second LDS compatible resin and entirely through the wafer to ones of the plurality of recesses, which extend into a surface of the wafer. Ones of the plurality of troughs extend from ones of the plurality of first openings to ones of the plurality of second openings. The troughs extend into the second LDS compatible resin. The channels extend between corresponding ones of the plurality of second recesses and extend into the layer of the second resin.

The LDS process includes exposing the wafer and the second LDS compatible resin to a laser to remove portions of the wafer and the second LDS compatible resin. While the laser removes portions of the wafer and the second LDS compatible resin, the laser also activates the first additive material and the second additive material within the wafer and the second LDS compatible resin, respectively. Activation of the first and second additive materials results in the formation of a first conductive layer. Micro-rough surfaces are also formed by exposing the laser to the wafer and the second LDS compatible resin along which the first conductive layer extends. The first conductive layer may include a plurality of discontinuous conductive portions. The first conductive layer extends along and at least partially covers respective sidewalls and respective surfaces delimiting the plurality of first openings, the plurality of second openings, the plurality of recesses, the plurality of troughs, and the plurality of channels, respectively.

After patterning the wafer and the second LDS compatible resin through the LDS process, a chemical plating process is performed such that a second conductive layer is formed on the first conductive layer. The second conductive layer fills in any discontinuities along the first conductive layer such that the second conductive layer continuously extends along the plurality of first openings, the plurality of second openings, the plurality of recesses, the plurality of troughs, and the plurality of channels. After the chemical plating process, an electrolytic plating process is performed forming a third conductive layer on the second conductive layer. Forming the first, second, and third conductive layers results in the plurality of first openings, the plurality of second openings, the plurality of recesses, the plurality of troughs, and the plurality of channels being at least partially filled with conductive materials of the first, second, and third conductive layers, respectively. The first, second, and third conductive layers being stacked on each other forms the plurality of conductive structures.

After the first, second, and third conductive layers are formed, the wafer, the second LDS compatible resin layer, and the first, second, and third conductive layers are singulated along the plurality of channels. This singulation process may be performed by a saw tool, a cutting tool, or some other type of tool for singulating a wafer assembly into individual ones of the at least one embodiment of the leadframe-less semiconductor package of the present disclosure.

Generally, methods of forming conventional semiconductor packages include utilizing a leadframe to form conductive components (e.g., bus bars, die pads, leads, etc.) within the conventional semiconductor packages. For example, the conventional semiconductor packages may be formed by coupling a plurality of semiconductor die to die pad portions (e.g., portions that will become die pads of singulated ones of the conventional semiconductor packages) of the leadframe. After coupling the plurality of die to the die pad portions, a plurality of electrical wires may be formed by a bond and stitch technique to couple contact pads at respective active surfaces of the plurality of die to respective ones of a plurality of lead portions (e.g., portions that will become leads of singulated ones of the conventional semiconductor packages) of the leadframe. After the electrical wires are formed, a molding compound may be formed utilizing a mold tool to cover the plurality of die, the plurality of leads, the plurality of die pads, and the plurality of electrical wires.

The electrical wires may be embedded or encased with the molding compound. After forming the molding compound, the leadframe and the molding compound are singulated along saw lines (e.g., kerf lines) to form singulated (e.g., individual ones) of conventional semiconductor device packages.

Unlike the method of manufacturing the at least one embodiment of the leadframe-less semiconductor package as described above, in order to perform the method of formation of the conventional semiconductor packages as set forth above, there is generally an additional lead time for obtaining leadframes for forming the conventional semiconductor packages from a third party. This additional lead time means that a period of time a customer waits for receipt shipment of the conventional semiconductor packages is generally longer as compared to a period of time the customer waits for receipt of the at least one embodiment of the leadframe-less semiconductor package.

For example, when leadframes are obtained from a third party manufacturing to manufacture the conventional semiconductor packages, a lead time for manufacturing the conventional semiconductor packages may be greater than a lead time for manufacturing the leadframe-less semiconductor packages of the present disclosure. This difference in lead times may result in fewer of the conventional semiconductor packages being sold and shipped to the customer relative to the leadframe-less semiconductor package.

As the method of forming the conventional semiconductor packages includes the leadframes, an overall thickness of the conventional semiconductor packages may be limited in being reduced due to the use of the leadframe. In other words, the conventional semiconductor packages may be relatively thick as compared to the leadframe-less semiconductor package of the present disclosure that is leadframe-less. In other words, the leadframe-less semiconductor packages of the present disclosure may be relatively thinner than a conventional semiconductor package in which a leadframe is utilized to manufacture the conventional semiconductor package. For example, the leadframes may be limited in being reduced in thickness as the leadframes need to be thick enough to avoid deformation while the leadframes are being handled during shipping and manufacturing. This limited reduction in thickness of the leadframes limits the amount thicknesses of conventional semiconductor packages may be reduced such that the overall thicknesses of the conventional semiconductor packages are greater than the overall thicknesses of the leadframe-less semiconductor packages of the present disclosure.

As the method of forming the conventional semiconductor packages includes forming the electrical wires, a clearance area between the leads and the die is provided such that the electrical wires may be formed to couple the die to the leads. Utilizing the electrical wires to form these electrical connections between the leads and the die in the conventional semiconductor packages may result in the overall thickness of the conventional semiconductor packages being limited such that the overall thickness may not be further reduced. In other words, the leadframe-less semiconductor packages of the present disclosure may be relatively thinner than a conventional semiconductor package in which the leadframe is utilized to manufacture the conventional semiconductor package.

FIG. 1A illustrates a perspective view of a semiconductor package 100, which is leadframe-less, of the present disclosure. The semiconductor package 100 may be referred to as a leadframe-less semiconductor package, a leadframe-less integrated circuit die package, or may be referred to as some other similar or like type of package that does not include a leadframe.

The semiconductor package 100 includes a first layer 102, a second layer 104, and a third layer 106. The second layer 104 is on the first layer 102 and the third layer 106 is on the second layer 104. The first layer 102 may be fully separated from the third layer 106 by the second layer 104. In other words, the second layer 104 is sandwiched between the first layer 102 and the third layer 106.

In this embodiment of the semiconductor package 100, the first layer 102 includes a first additive material and the second layer 104 is doped includes a second additive material. For example, the first layer 102 may be doped with the first additive material and the second layer 104 may be doped with the second additive material. The first and second additive materials may be non-conductive metallic compounds that are converted into a conductive material (e.g., activated) when exposed to a laser during a laser direct structuring (LDS) process. The first layer 102 with the first additive material may be a first LDS layer made of an LDS compatible resin with or including the first additive material, and the second layer 104 may be a second LDS layer made of an LDS compatible resin with or including the second additive material. The third layer 106 is a non-conductive layer, for example, a molding compound, a resin, an epoxy, a polymeric compound, or some other type of non-conductive layer. Generally, the third layer 106 is not doped with or does not include an additive material unlike the first and second layers 102, 104, respectively, which are doped with or include non-conductive additive materials that is converted into a conductive material when exposed to a laser during an LDS process.

A first surface 108 of the semiconductor device package 100 is opposite to a second surface 110 of the semiconductor device package 100. The first surface 108 includes a respective surface of the first layer 102 and the second surface 110 includes a respective surface of the third layer 106. The first surface 108 faces away from the second and third layers 104, 106, respectively, and the second surface 110 faces away from the first and second layers 102, 104, respectively.

A plurality of first sidewalls 112 of the semiconductor package 100 includes respective sidewalls of the first, second, and third layers 102, 104, 106, respectively, and respective exposed sidewalls 124 of a plurality of leads 114. The respective sidewalls of the first, second, and third layers 102, 104, 106 present at the plurality of first sidewalls 112 are substantially coplanar and substantially flush with each other. The respective exposed sidewalls 124 of the plurality of leads 114 present at the plurality of first sidewalls 112 are substantially coplanar and substantially flush with the respective sidewalls of the first, second, and third layers 102, 104, 106, respectively.

As readily seen in FIG. 1A, respective leads of the plurality of leads 114 are present at the first sidewall 112 readily visible in FIG. 1A. While not visible in FIG. 1A, respective leads of the plurality of leads 114 are present along the respective first sidewall 112 opposite to the first sidewall 112 as readily visible in FIG. 1A.

A plurality of second sidewalls 116 of the semiconductor package 100 includes respective sidewalls of the first, second, and third layers 102, 104, 106. However, unlike the plurality of first sidewalls 112 at which the respective exposed sidewalls 124 of the plurality of leads 114 are exposed, the leads 114 are not present at the plurality of second sidewalls 116. The respective sidewalls of the first, second, and third layers 102, 104, 106 present at the plurality of second sidewalls 116 are substantially coplanar and substantially flush with each other.

The first surface 108 extends between opposite ones of the plurality of first sidewalls 112 and between opposite ones of the plurality of second sidewalls 116. The second surface 110 extends between opposite ones of the plurality of first sidewalls 112 and between opposite ones of the plurality of second sidewalls 116.

The first sidewalls 112 are transverse to the plurality of second sidewalls 116. The first sidewalls 112 extend between opposite ones of the plurality of second sidewalls 116, and the first sidewalls 112 have a first length 118 extending between opposite ones of the plurality of second sidewalls 116.

The second sidewalls 116 are transverse to the first sidewalls 112. Each one of the plurality of second sidewalls 116 extend between opposite ones of the plurality of first sidewalls 112, and each one of the plurality of second sidewalls 116 have a second length 120 extending between opposite ones of the plurality of first sidewalls 112. In this embodiment of the semiconductor package 100, the second length 120 is substantially equal to the first length 118 such that the semiconductor package 100 has a square profile when viewed in a bottom plan or a top plan view. The bottom plan view of the semiconductor package 100 may be readily seen in FIG. 1D.

In alternative embodiments of the semiconductor package 100, the first length 118 may be greater than the second length 120 or the first length 118 may be less than the second length 120 such that the semiconductor package 100 has a rectangular profile when viewed in a bottom plan or a top plan view. In alternative embodiments of the semiconductor package 100, there may be more than five respective leads of the plurality of leads 114 along the first sidewall 112 as readily visible in FIGS. 1A and 1B, or there may be less than five respective leads of the plurality of leads 114 along the first sidewall 112 as readily visible in FIGS. 1A and 1B.

In this embodiment of the semiconductor package 100, no leads are present along the plurality of second sidewalls 116. In an alternative embodiment of the semiconductor package 100, respective leads of the plurality of leads 114 may be present along ones of the plurality of second sidewalls 116.

Figure 1B:
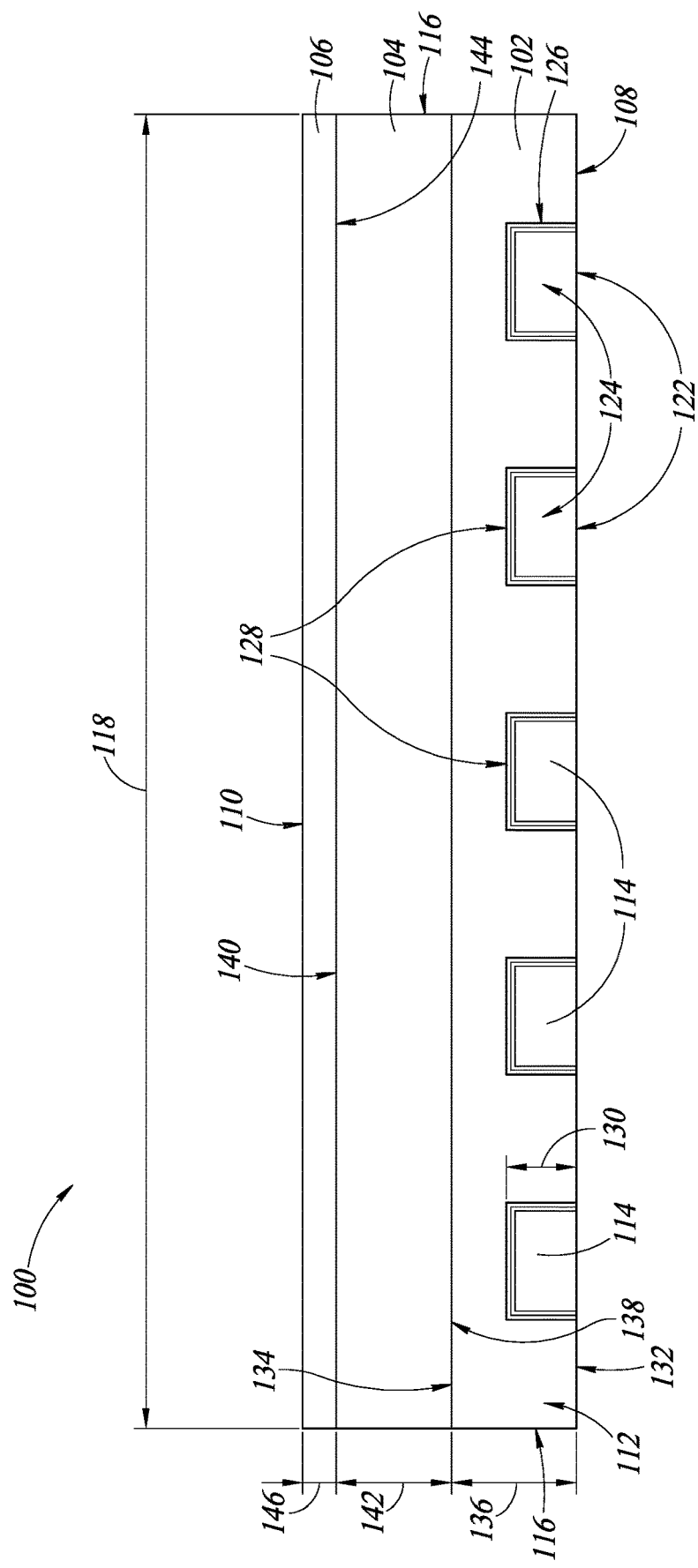
FIG. 1B illustrates a left side view of the embodiment of the leadframe-less semiconductor package.

FIG. 1B is a side view of one of the first sidewalls 112 of the plurality of first sidewalls 112 along which ones of the plurality of leads 114 are present. Each one of the plurality of leads 114 extend into the first surface 108 of the semiconductor package 100 such that the leads 114 extend into the first layer 102. The leads 114 include exposed surfaces 122 that are exposed from the first surface 108 of the semiconductor package 100. The exposed surfaces 122 are substantially coplanar and substantially flush with an external surface 132 of the first layer 102. The exposed sidewalls 124 of the plurality of leads 114 are exposed from the respective sidewall of the first layer 102 along the first sidewall 112 at which the ones of the plurality of leads 114 are present. The leads 114 further include sidewalls 126 that are transverse to the exposed sidewalls 124 and surfaces 128 opposite to the exposed surfaces 122. The sidewalls 126 transverse to the exposed sidewalls 124 are covered by the first layer 102 such that the sidewalls 126 extend into the first layer 102. The surfaces 128 are covered by the first layer 102. The surfaces 128 may be end surfaces at which each one of the plurality of leads 114 terminates within the first layer 102 before reaching the second layer 104.

The exposed surfaces 122 may be wettable surfaces such that a solder material (e.g., solder alloy) may be formed on the exposed surfaces 122 for coupling or mounting the semiconductor package 100 to an external electrical component or device (e.g., printed circuit board, another semiconductor package, or some other similar type of electrical component or device external to the semiconductor package 100). In other words, the exposed surfaces 122 may have wetting characteristics such that a solder material may be formed on the exposed surfaces. After the solder material is formed on the exposed surfaces, the solder material may be reflowed to form solder balls or solder conductive structures on the exposed surfaces 122 that may be utilized for coupling the semiconductor package 100 to the external electronic component or device.

A first thickness 130 of the plurality of leads 114 extends from one of the exposed surfaces 122 to a corresponding one of the surfaces 128. The first thickness 130 may range from 15-µm to 50-µm.

As discussed above, the first surface 108 of the semiconductor package 100 includes the external surface 132 of the first layer 102 and the exposed surfaces 122 of the plurality of leads 114. The first layer 102 further includes an internal surface 134 opposite to the external surface 132. The external surface 132 may be referred to as a first surface of the first layer 102, and the internal surface 134 may be referred to as a second surface of the first layer 102. A second thickness 136 of the first layer 102 extends from the external surface 132 to the internal surface 134. The second thickness 136 is greater than the first thickness 130. The second thickness 136 may range from 0.2-mm to 0.3-mm.

The second layer 104 is on the internal surface 134 of the first layer 102. The second layer 104 includes a first internal surface 138 on the internal surface 134 of the first layer 102, and the first internal surface 138 of the second layer 104 faces towards the first layer 102. The second layer 104 further includes a second internal surface 140 opposite to the first internal surface 138. The first internal surface 138 may be referred to as a first surface of the second layer 104, and the second internal surface 140 may be referred to as a second surface of the second layer 104. A third thickness 142 of the second layer 104 extends from the first internal surface 138 to the second internal surface 140. In this embodiment, the third thickness 142 may be substantially equal to the second thickness 136 of the first layer 102.

While in this embodiment the third thickness 142 is substantially equal to the second thickness 136, in some embodiments, the second thickness 136 may be greater than the third thickness 142. In yet some other embodiments, the second thickness 136 may be less than the third thickness 142.

The third layer 106 is on the second internal surface 140 of the second layer 104. The third layer 106 is spaced apart from the first layer 102 by the third layer 106. The third layer 106 includes a first internal surface 144 on the second internal surface 140 of the second layer 104. The third layer 106 includes the second surface 110 of semiconductor package 100. The second surface 110 is opposite to the first internal surface 144 of the second layer 104. The first internal surface 144 may be referred to as a first surface of the third layer 106, and the second surface 110 of the semiconductor package 100 may be referred to as a second surface of the third layer 106. A fourth thickness 146 of the third layer 106 extends from the first internal surface 144 of the third layer 106 to the second surface 110 of the third layer 106. The fourth thickness 146 is less than the first thickness 130, is less than the second thickness 136, and is less than the third thickness 142. In some embodiments, the fourth thickness 146 may be substantially equal to the first thickness 130 of the plurality of leads 114. In some embodiments, the fourth thickness 146 may be substantially equal to the second thickness 136 or may be substantially equal to the third thickness 142.

Figure 1C:
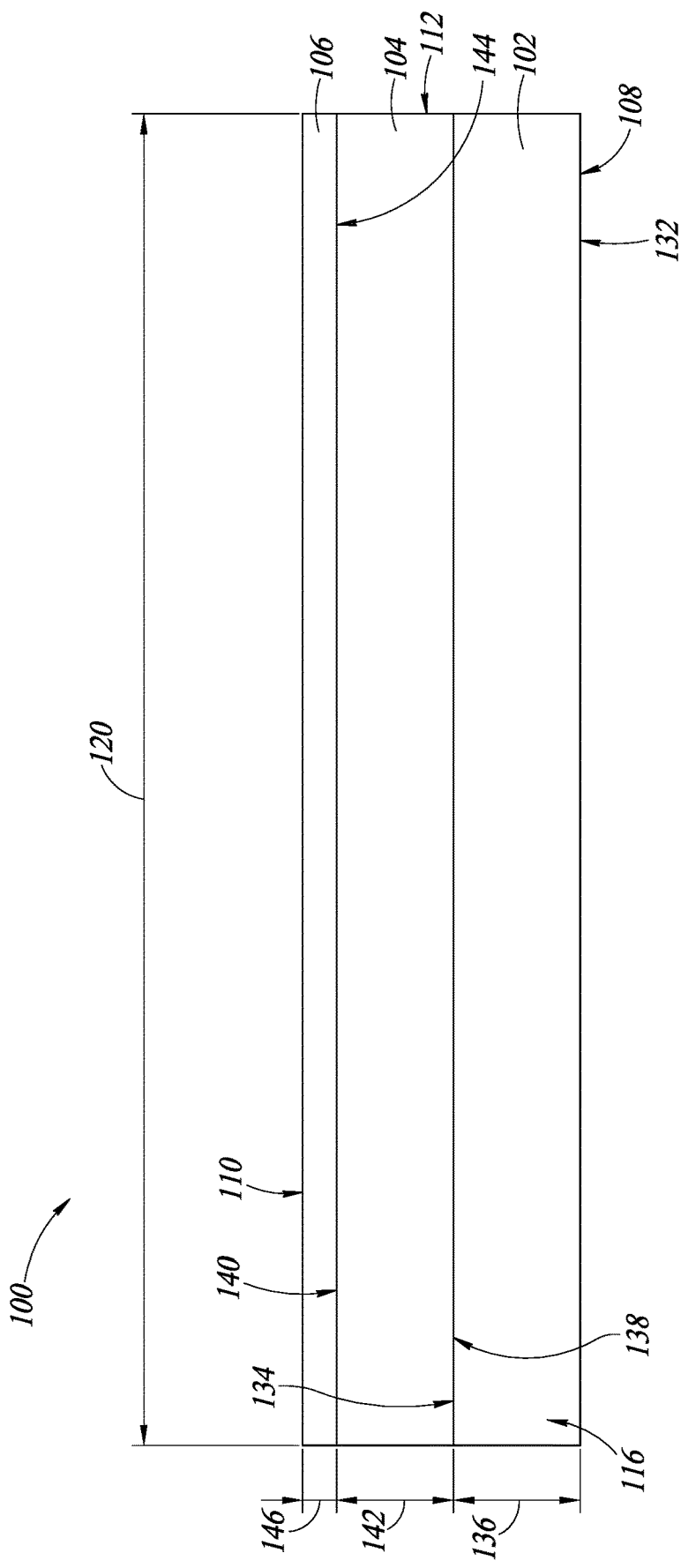
FIG. 1C illustrates a front view of the embodiment of the leadframe-less semiconductor package.

FIG. 1C is a side view of one of the respective second sidewalls 116 of the plurality of second sidewalls 116. In this embodiment, leads are not present along the plurality of second sidewalls 116. However, in some other alternative embodiments, leads may be present along the plurality of second sidewalls 116 similar to the plurality of leads 114 present along the plurality of first sidewalls 112.

Figure 1D:
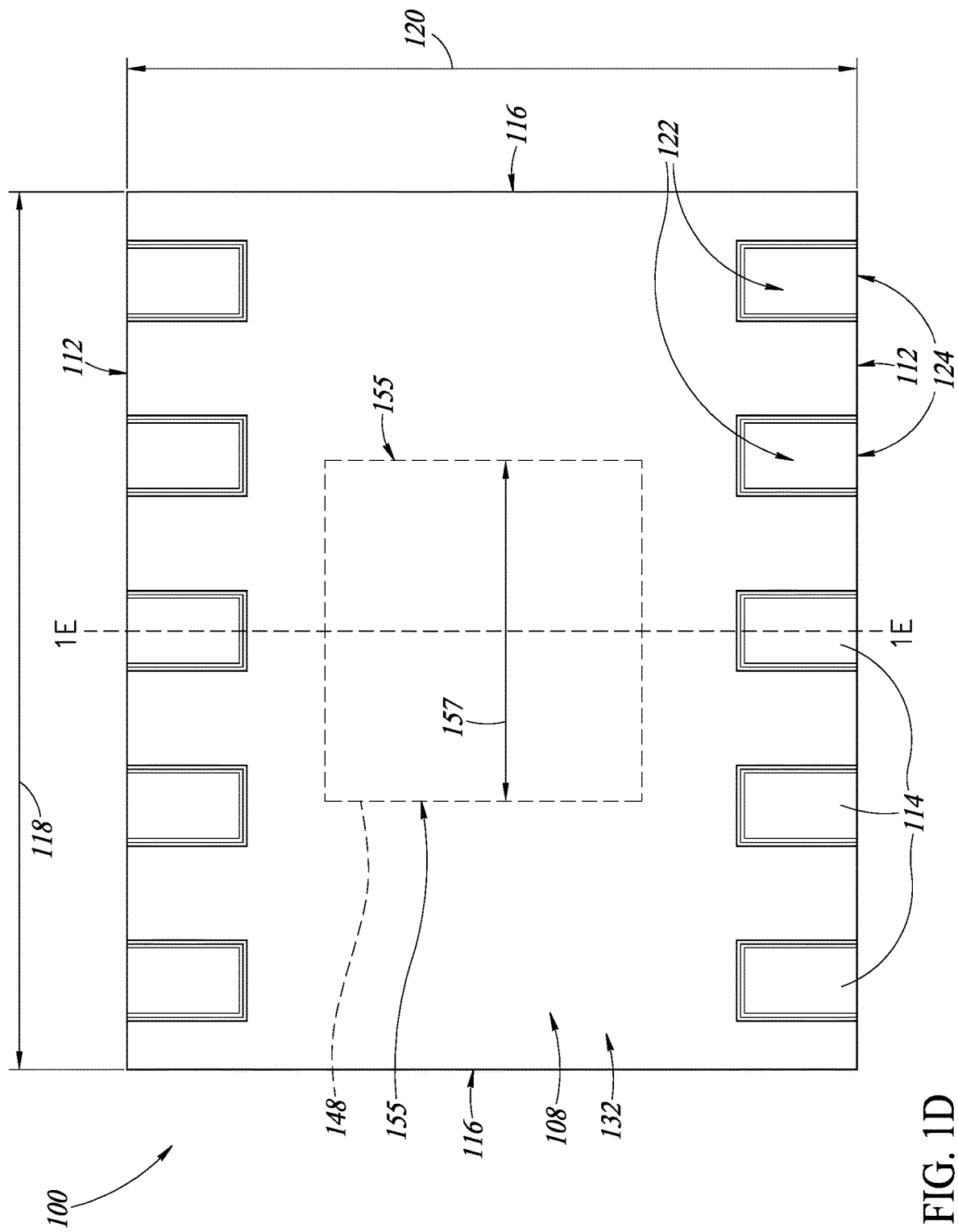
FIG. 1D illustrates a bottom view of the embodiment of the leadframe-less semiconductor package.

FIG. 1D is a bottom plan view of the semiconductor package 100. A die 148 is embedded within the semiconductor package 100 and is in electrical communication with respective ones of the plurality of leads 114. The die 148 includes a plurality of sidewalls 155 and a dimension 157 that extends between opposite ones of the plurality of sidewalls 155. The die 148 may be a micro-electromechanical system (MEMS) die, an application-specific integrated circuit (ASIC) die, a controller die, an integrated circuit die, or some other type of die that may be embedded or encased within the semiconductor package 100.

Figure 1E:
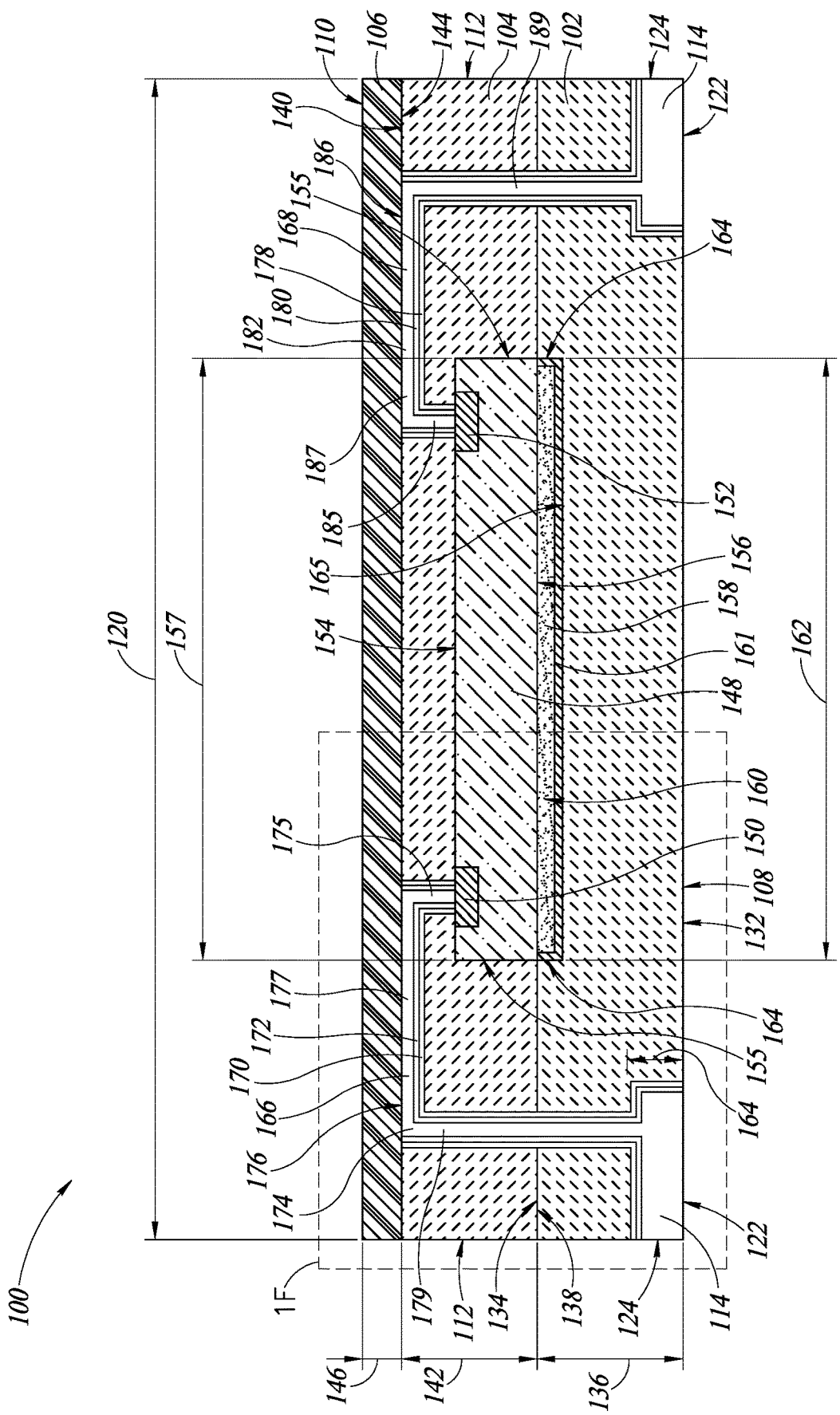
FIG. 1E illustrates a cross-sectional view of the embodiment of the leadframe-less semiconductor package taken along line 1B-1B as shown in FIGS. 1A and 1D.

FIG. 1E is a cross-sectional view taken along line 1E-1E as shown in FIGS. 1A and 1D. The cross-sectional view as shown in FIG. 1E is taken through the die 148, which includes a first contact pad 150 and a second contact pad 152 at a first surface 154 of the die 148. The first surface 154 of the die faces away from the first surface 108 of the semiconductor package 100, and the first surface 154 may be an active surface of the die 148. The die 148 further includes a second surface 156 opposite to the first surface 154. The second surface 156 may be a passive surface of the die 148. The second surface 156 of the die 148 is coupled to the first layer 102 of the semiconductor package 100 by an adhesive 158 that is present within a recess 160 in the first layer 102. The adhesive 158 may be a die attach film, a glue, or some other type of material for attaching or coupling the die 148 to the first layer 102 of the semiconductor package 100.

The recess 160 extends into the internal surface 134 of the first layer 102. The recess 160 has a dimension 162 that extends from opposite sidewalls 164 of the recess 160. The sidewalls 164 at least partially delimit the recess 160, and the sidewalls 164 extend into the internal surface 134 of the first layer 102. In this embodiment of the package 100, the dimension 157 of the die 148 is substantially equal to the dimension 162 of the recess 160. In this embodiment of the package 100, the sidewalls 164 of the recess 160 are substantially coplanar and substantially flush with corresponding ones of the sidewalls 155 of the die 148.

A conductive layer 161 is on and covers respective surfaces of the first layer 102 that delimit the recess 160. The respective surfaces of the first layer 102 that delimit the recess 160 may be micro-rough surfaces. These micro-rough surfaces may more readily interlock with the adhesive 158 such that the adhesive 158 securely couples the die 148 to the first layer 102. The conductive layer 161 lines the recess 160 as shown in FIG. 1E. For example, the conductive layer 161 covers the sidewall 164 and covers a surface 165 of the first layer 102 that extends between opposite ones of the sidewalls 164.

A first conductive structure 166 extends from the first contact pad 150 to the respective lead 114 at the left-hand side of the semiconductor package 100 based on the orientation as shown in FIG. 1E. A second conductive structure 168 extends from the second contact pad 152 to the respective lead 114 at the right-hand side of the semiconductor package 100 based on the orientation as shown in FIG. 1E.

The first conductive structure 166 includes a first conductive layer 170, a second conductive layer 172, and a third conductive layer 174. The first conductive layer 170 is on and covers respective surfaces of the first layer 102 and respective surfaces of the second layer 104 that delimit the first conductive structure 166. These respective surfaces of the first layer 102 and respective surfaces of the second layer 104 delimiting the first conductive structure 166 may be micro-rough surfaces along which the first conductive layer 170 extends. These micro-rough surfaces may more readily couple the second conductive layer 172 to the first conductive layer 170 and the third conductive layer 174 to the second conductive layer 172 such that the second conductive layer 172 is securely coupled the first conductive layer 170 and the third conductive layer 174 is securely coupled to the second conductive layer 172. The second conductive layer 172 is on and covers the first conductive layer 170. The third conductive layer 174 is on and covers the second conductive layer 174. The first conductive layer 170 may be separated from the third conductive layer 174 by the second conductive layer 172 such that the second conductive layer 172 is sandwiched between the first conductive layer 170 and the third conductive layer 174.

While in FIG. 1E the first, second, and third conductive layers 170, 172, 174, respectively, are shown as continuous layers of conductive material, in an alternative embodiment the first, second, and third conductive layers 170, 172, 174, respectively, may be made up of a plurality of discontinuous portions of the conductive material. The first, second, and third conductive layers 170, 172, 174 may be formed utilizing a laser direct structuring (LDS) process including exposing the first and second layers 102, 104 to a laser to activate the additive materials present within the first and second layers 102, 104 to form the first conductive layer 170, performing a first plating process to grow the second conductive layer 172 on the first conductive layer 174, and performing a second plating process to form the third conductive layer 174 on the second conductive layer 172. The first conductive structure 166 further includes a surface 176 substantially coplanar and substantially flush with the second internal surface 140 of the second layer 104. In some embodiments, the surface 176 may slightly protrude from the second internal surface 140. In some embodiments, the surface 176 may be slightly recessed within the second internal surface 140 such that third layer 106 slightly extends into the second layer 104. The surface 176 is covered by the third layer 106.

The first conductive structure 166 is integral to the respective lead 114 at the left-hand side of the semiconductor package 100. The first conductive structure 166 may include the respective lead 114, and the respective lead 114 may include the first, second, and third conductive layers 170, 172, 174, respectively.

The first conductive structure 166 further includes a first portion 175, a second portion 177, and a third portion 179. The first portion 175 is on the first contact pad 150. The second portion 177 extends from the first portion 175 to the third portion 179, which is spaced apart from the first portion 175. The third portion 179 extends from the second portion 177 to the respective lead 114 at the left-hand side of the semiconductor package 100. The first and third portions 175, 179 of the first conductive structure 166 may be conductive via portions, and the second portion 177 may be a trace portion that couples the first and third portions 175, 179 together. The first and third portions 175, 179 of the first conductive structure 166 are transverse to the second portion 177 of the first conductive structure 166. The lead 114 at the left-hand side of the semiconductor package 100 is transverse to the third portion 179. The lead 114 at the left-hand side of the semiconductor package 100 may be a portion of the first conductive structure 166.

The second conductive structure 168 includes a fourth conductive layer 178, a fifth conductive layer 180, and a sixth conductive layer 182. The fourth conductive layer 178 is on and covers respective surfaces of the first layer 102 and respective surfaces of the second layer 104 that delimit the first conductive structure 166. These respective surfaces of the first layer 102 and respective surfaces of the second layer 104 delimiting the second conductive structure 168 may be micro-rough surfaces along which the fourth conductive layer 178 extends. These micro-rough surfaces may more readily couple the fifth conductive layer 180 to the fourth conductive layer 178 and the sixth conductive layer 182 to the fifth conductive layer 180 such that the fifth conductive layer 178 is securely coupled the fourth conductive layer 178 and the sixth conductive layer 182 is securely coupled to the fifth conductive layer 180. The fifth conductive layer 180 is on and covers the fourth conductive layer 178. The sixth conductive layer 182 is on and covers the fifth conductive layer 180. The fourth conductive layer 178 may be separated from the sixth conductive layer 182 by the fifth conductive layer 180 such that the fifth conductive layer 180 is sandwiched between the fourth conductive layer 178 and the sixth conductive layer 182.

While in FIG. 1E the fourth, fifth, and sixth conductive layers 178, 180, 182, respectively, are shown as continuous layers of conductive material, in an alternative embodiment the fourth, fifth, and sixth conductive layers 178, 180, 182, respectively, may be made up of a plurality of discontinuous portions of conductive material. The fourth, fifth, and sixth conductive layers 178, 180, 182 may be formed utilizing a laser direct structuring (LDS) process including exposing the first and second layers 102, 104 to a laser to activate the additive materials present within the first and second layers 102, 104 to form the fourth conductive layer 178, performing a first plating process to grow the fifth conductive layer 180 on the fourth conductive layer 178, and performing a second plating process to form the sixth conductive layer 182 on the fourth conductive layer 178. The second conductive structure 168 further includes a surface 186 substantially coplanar and substantially flush with the second internal surface 140 of the second layer 104. The surface 186 is covered by the third layer 106.

The second conductive structure 168 is integral to the respective lead 114 at the right-hand side of the semiconductor package 100. The second conductive structure 168 may include the respective lead 114, and the respective lead 114 may include the fourth, fifth, and sixth conductive layers 178, 180, 182, respectively.

The second conductive structure 168 further includes a first portion 185, a second portion 187, and a third portion 189. The first portion 185 is on the second contact pad 152. The second portion 187 extends from the first portion 185 to the third portion 189, which is spaced apart from the first portion 185. The third portion 189 extends from the second portion 187 to the respective lead 114 at the right-hand side of the semiconductor package 100. The first and third portions 185, 189 of the second conductive structure 168 may be conductive via portions, and the second portion 187 of the second conductive structure 168 may be a trace portion that couples the first portion 185 to the third portion 189. The first and third portions 185, 189 of the second conductive structure 168 are transverse to the second portion 187 of the second conductive structure 168. The lead 114 at the right-hand side is transverse to the third portion 189 of the second conductive structure 168. The lead 114 at the right-hand side of the semiconductor package 100 is a portion of the second conductive structure 168.

Figure 1F:
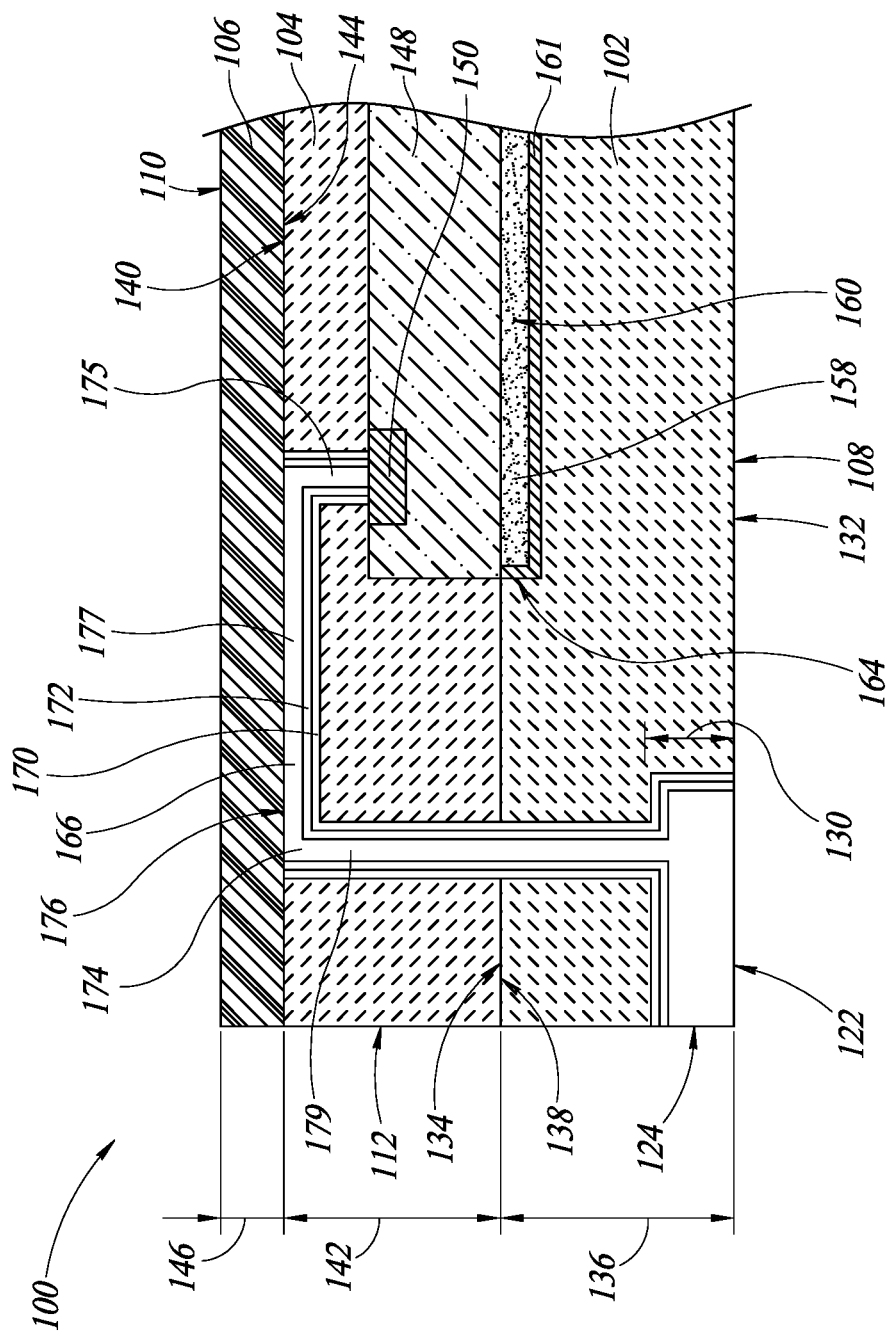
FIG. 1F illustrates an enlarged view of section 1F in the cross-sectional view of the embodiment of the leadframe-less semiconductor package as shown in FIG. 1E.

FIG. 1F is an enlarged section view of section 1F as surrounded by the dotted square as shown in FIG. 1E. FIG. 1F is an enlarged view of the first conductive structure 166 at the left-hand side of the semiconductor package 100 based on the orientation in FIG. 1E.

The exposed surface 122 of the respective lead 114, as shown in FIG. 1F, may include end surfaces of the first, second, and third conductive layers 170, 172, 174, respectively, that are substantially coplanar and substantially flush with each other. The exposed sidewall 124 of the respective lead 114, as shown in FIG. 1F, may include end surfaces of the first, second, and third conductive layers 170, 172, 174, respectively, that are substantially coplanar and substantially flush with each other. The surface 176 of the first conductive structure 166 may include end surfaces of the first, second, and third conductive layers 170, 172, 174, respectively, that are substantially coplanar and substantially flush with each other. As may be readily seen in FIG. 1F, the third conductive layer 174 may be thicker than the first and second conductive layers 170, 172, respectively. As may readily be seen in FIG. 1F, the first conductive layer 170 is less thick than the second layer 172. While this discussion is with respect to the first, second, and third conductive layers 170, 172, 174, respectively, of the first conductive structure 166, it will be readily appreciated that the above discussion may readily apply to the fourth, fifth, and sixth conductive layer 185, 187, 189, respectively, of the second conductive structure 168. In other words, the above discussion of the details of the first conductive structure 166 may readily apply to the details of the second conductive structure 168 as well.

Figure 2A:
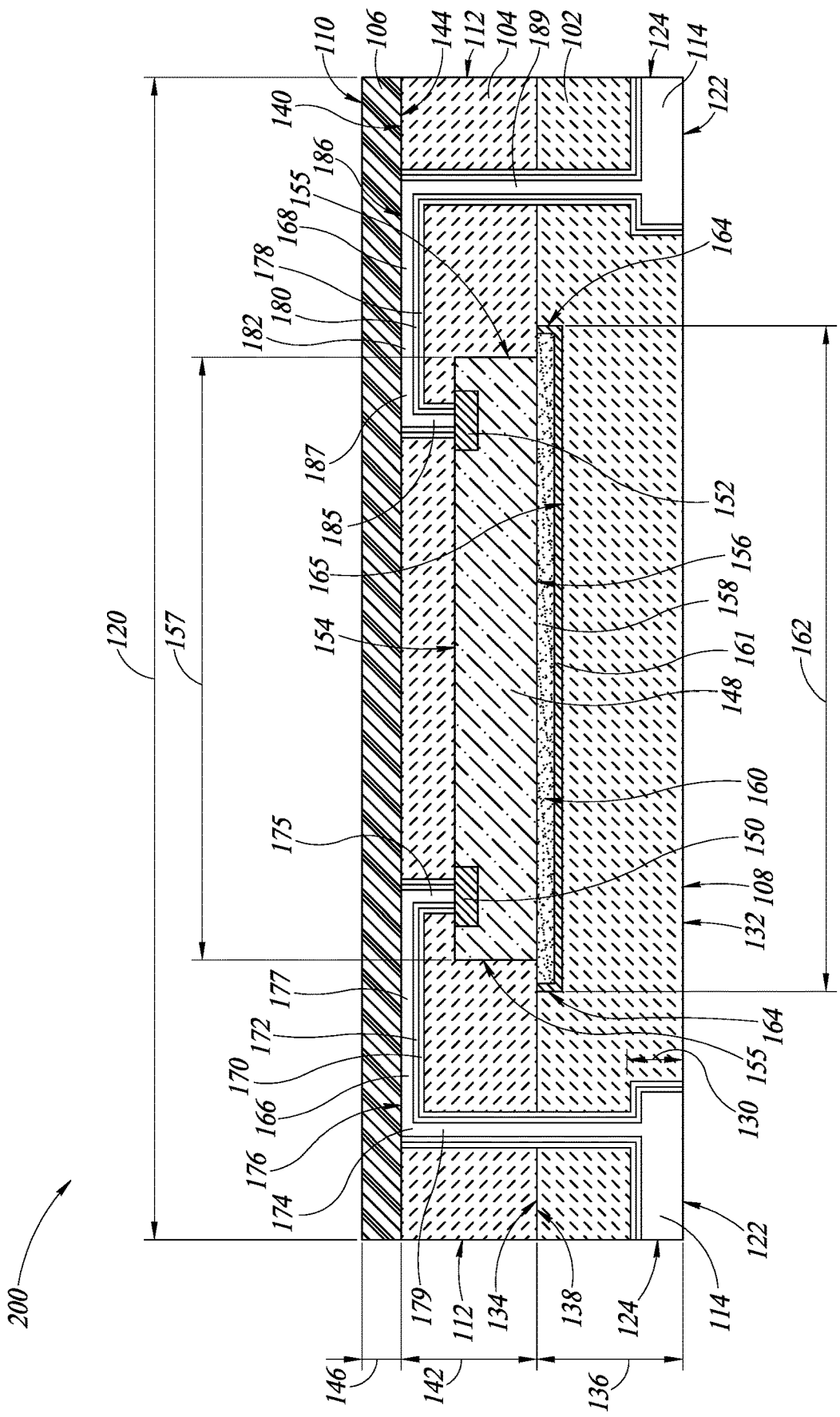
FIG. 2A illustrates a cross-sectional view of an alternative embodiment of a leadframe-less semiconductor package of the present disclosure.

FIG. 2A is directed to a cross-sectional view of an alternative embodiment of a semiconductor package 200, which is similar to the semiconductor package 100 as shown in FIGS. 1A-1F. However, unlike the semiconductor package 100 as shown in FIGS. 1A-1F, the dimension 162 of the recess 160 is greater than the dimension 157 of the die 148. In this alternative embodiment, the sidewalls 164 of the recess 160 are spaced apart from the sidewalls 155 of the die such that the sidewalls 164 of the recess 160 are not substantially coplanar and substantially flush with the sidewalls 155 of the die 148.

Figure 2B:
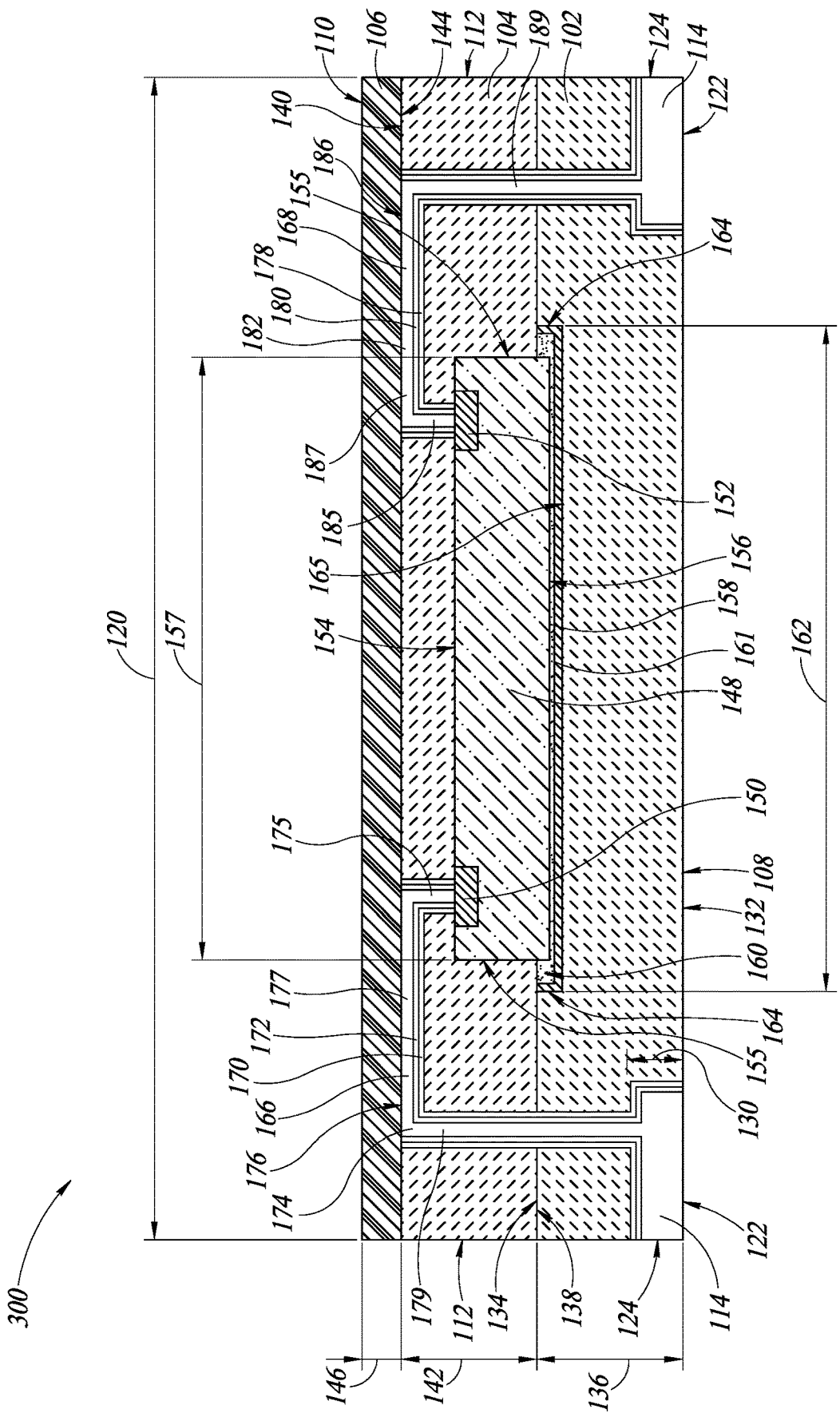
FIG. 2B illustrates a cross-sectional view of another alternative embodiment of a leadframe-less semiconductor package of the present disclosure.

FIG. 2B is directed to a cross-sectional view of an alternative embodiment of a semiconductor package 300, which is similar to the semiconductor package 200 as shown in FIG. 2A. However, unlike the semiconductor package 200 as shown in FIG. 2A, the die 148 extends into the adhesive 158 within the recess 160 and extends into the recess 160 as well. In other words, the die 148 is partially inset within the adhesive 158 within the recess 160. Similar to the semiconductor package 200 as shown in FIG. 2A, the dimension 162 of the recess 160 is greater than the dimension 157 of the die 148 as shown in the semiconductor package 300.

Unlike the semiconductor packages 100, 200, 300, in some embodiments, the dimension 162 of the recess 160 may be less than the dimension 157 of the die 148. When the dimension 162 of the recess 160 is less than the dimension 157 of the die 148, the sidewalls 164 may be underneath the second surface 156 of the die based on the orientation of the semiconductor packages 100, 200, 300, respectively, as shown in FIGS. 1E, 2A, and 2B, respectively.

While FIGS. 2A and 2B include the conductive layer 161 lining the recess 160, in some embodiments, the conductive layer 161 is not present. Instead, when the recess 160 is formed by another patterning technique other than an LDS process, the additive material within the first layer 102 is not activated when the recess 160 is formed such that the conductive layer 161 lining the recess 160 is not formed.

Figure 3A:
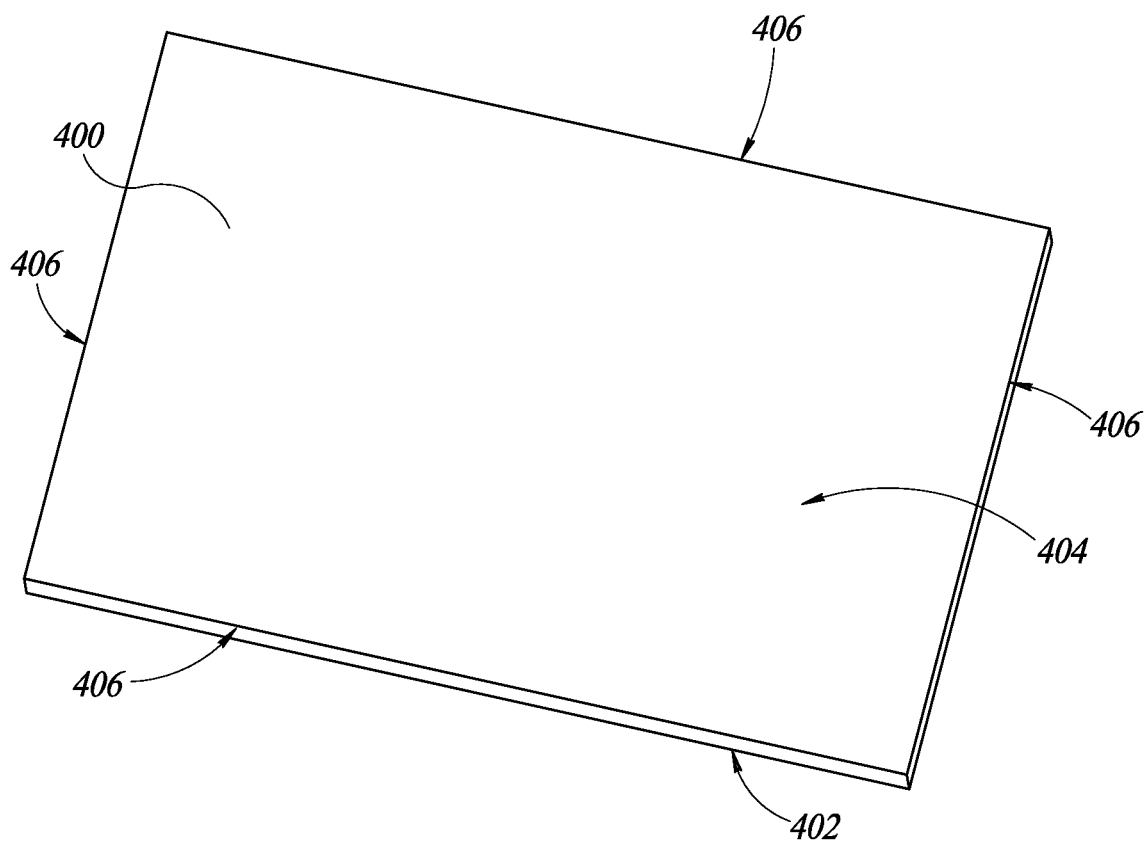
FIGS. 3A-3N illustrate an embodiment of a method of manufacturing the leadframe-less semiconductor package of the present disclosure as shown in FIGS. 1A-1F.
Figure 3B:
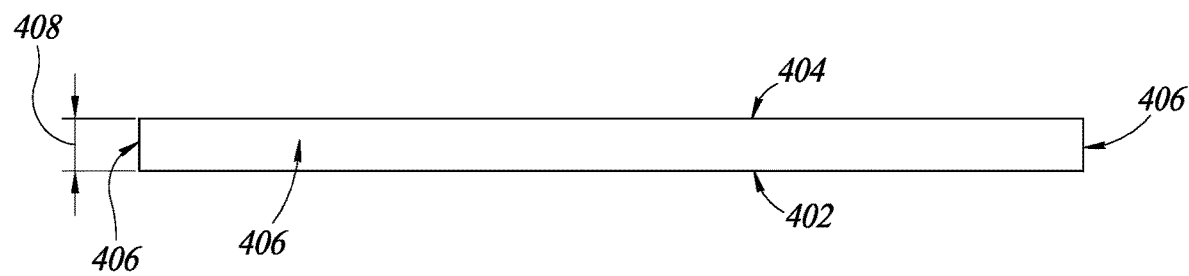
Figure 3C:
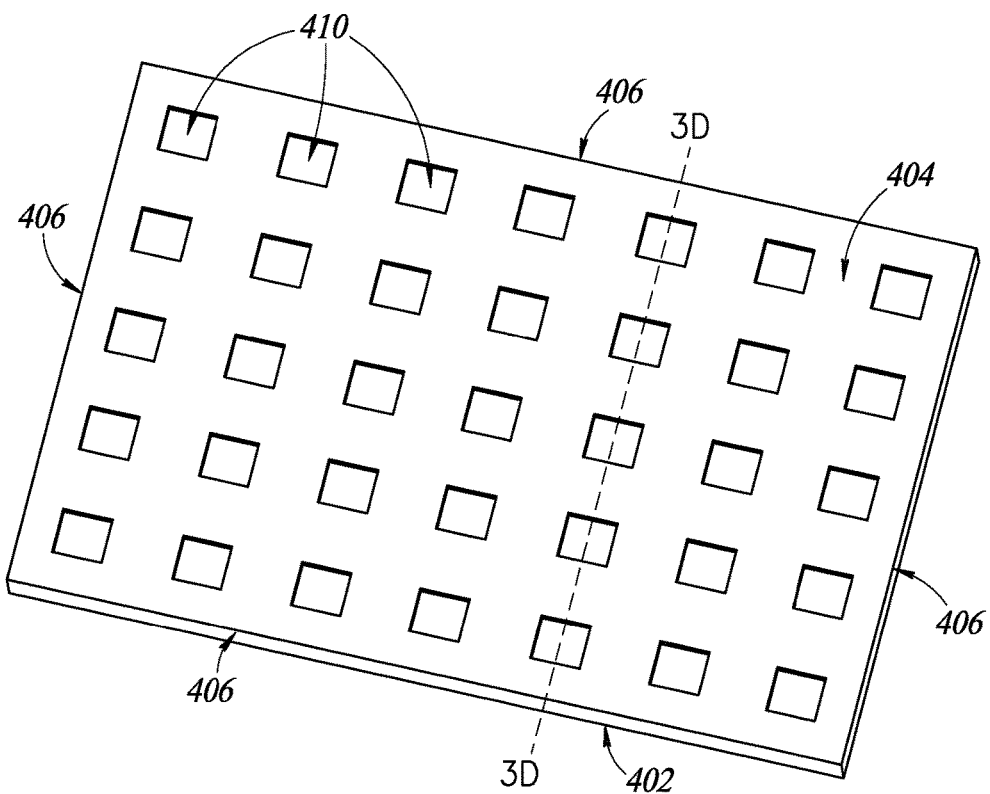
Figure 3D:
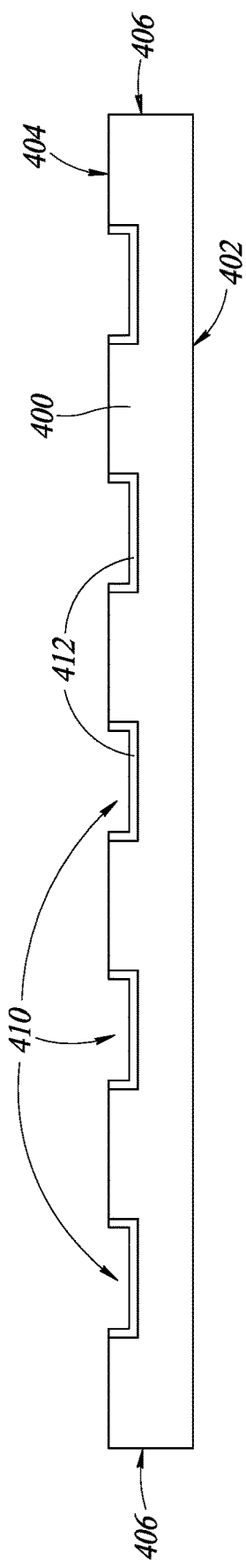
Figure 3E:
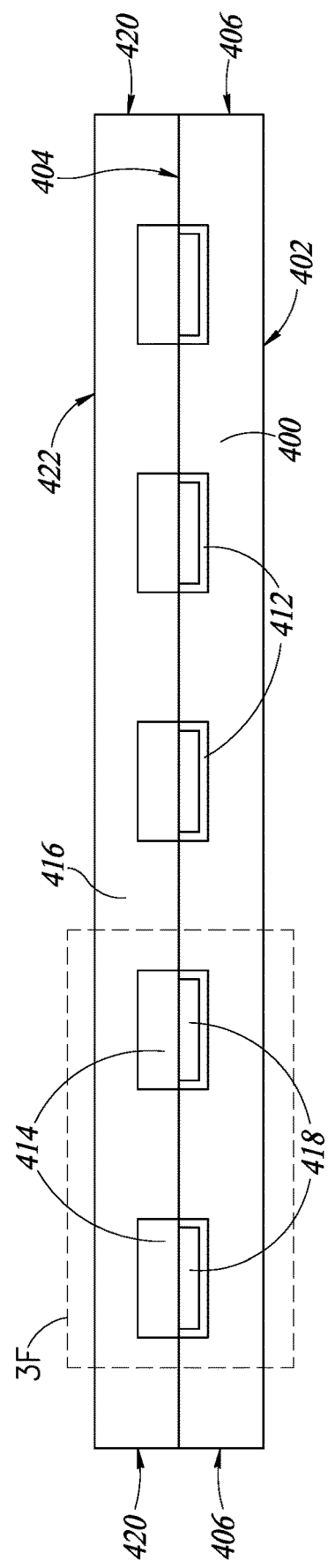
Figure 3F:
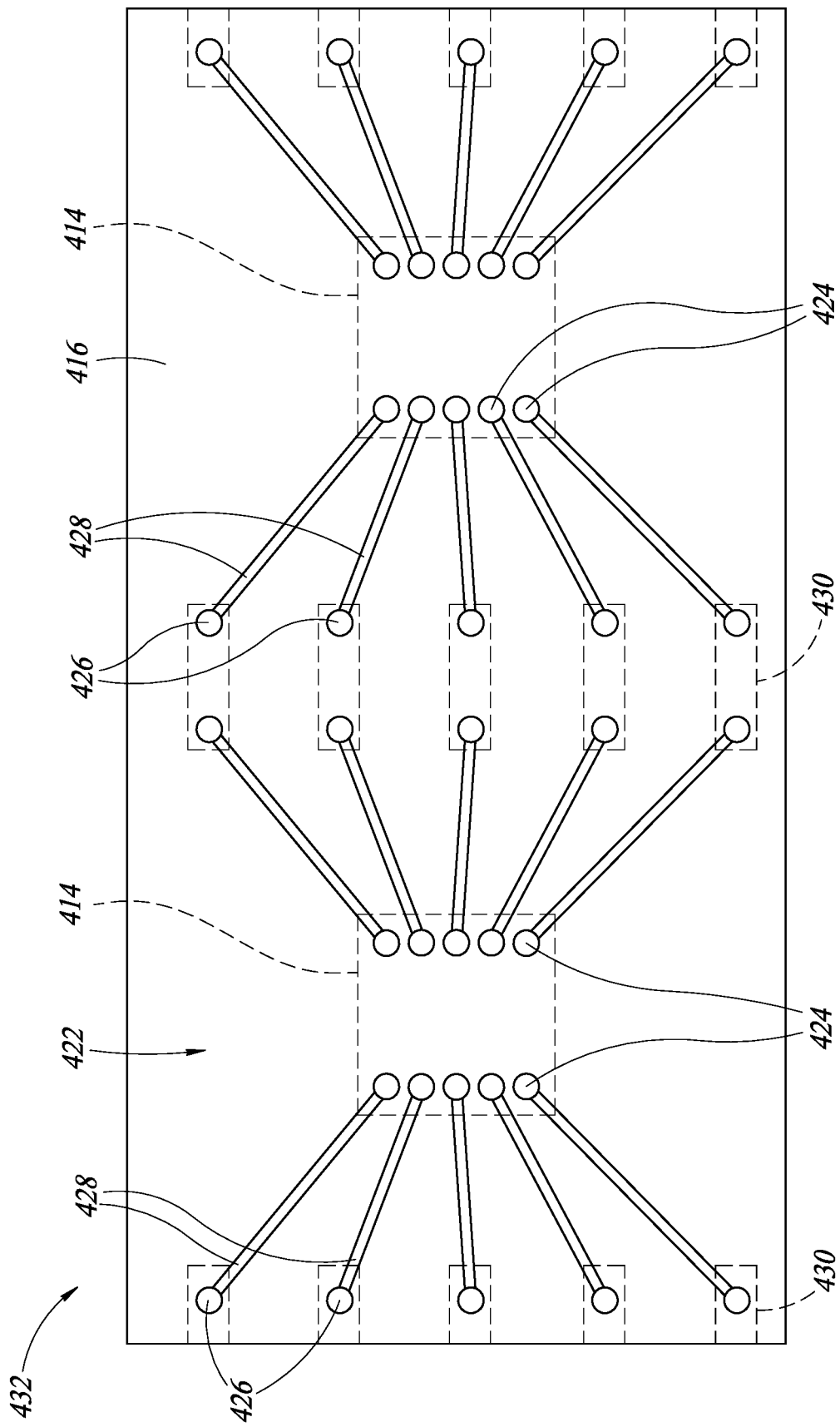
Figure 3G:
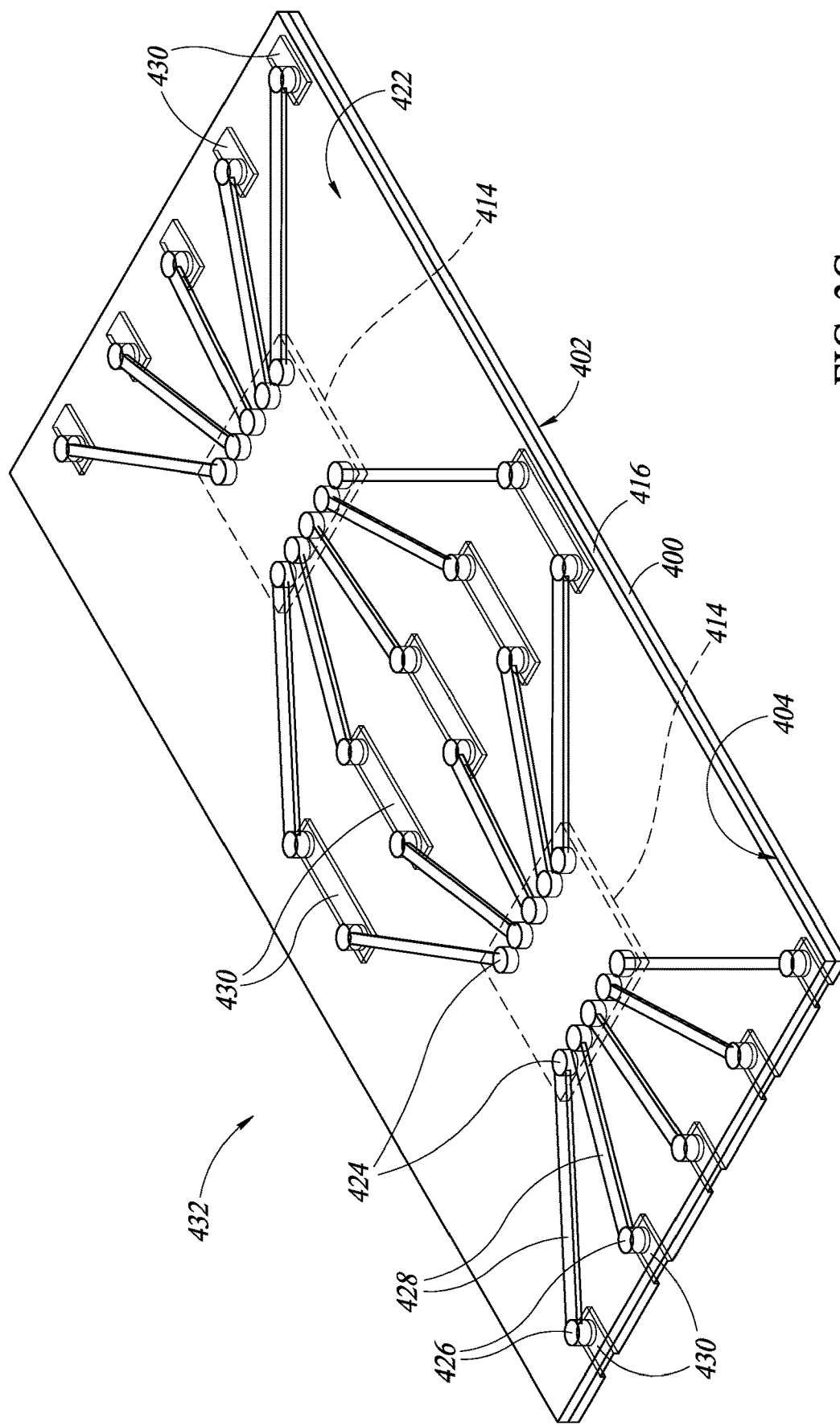
Figure 3H:
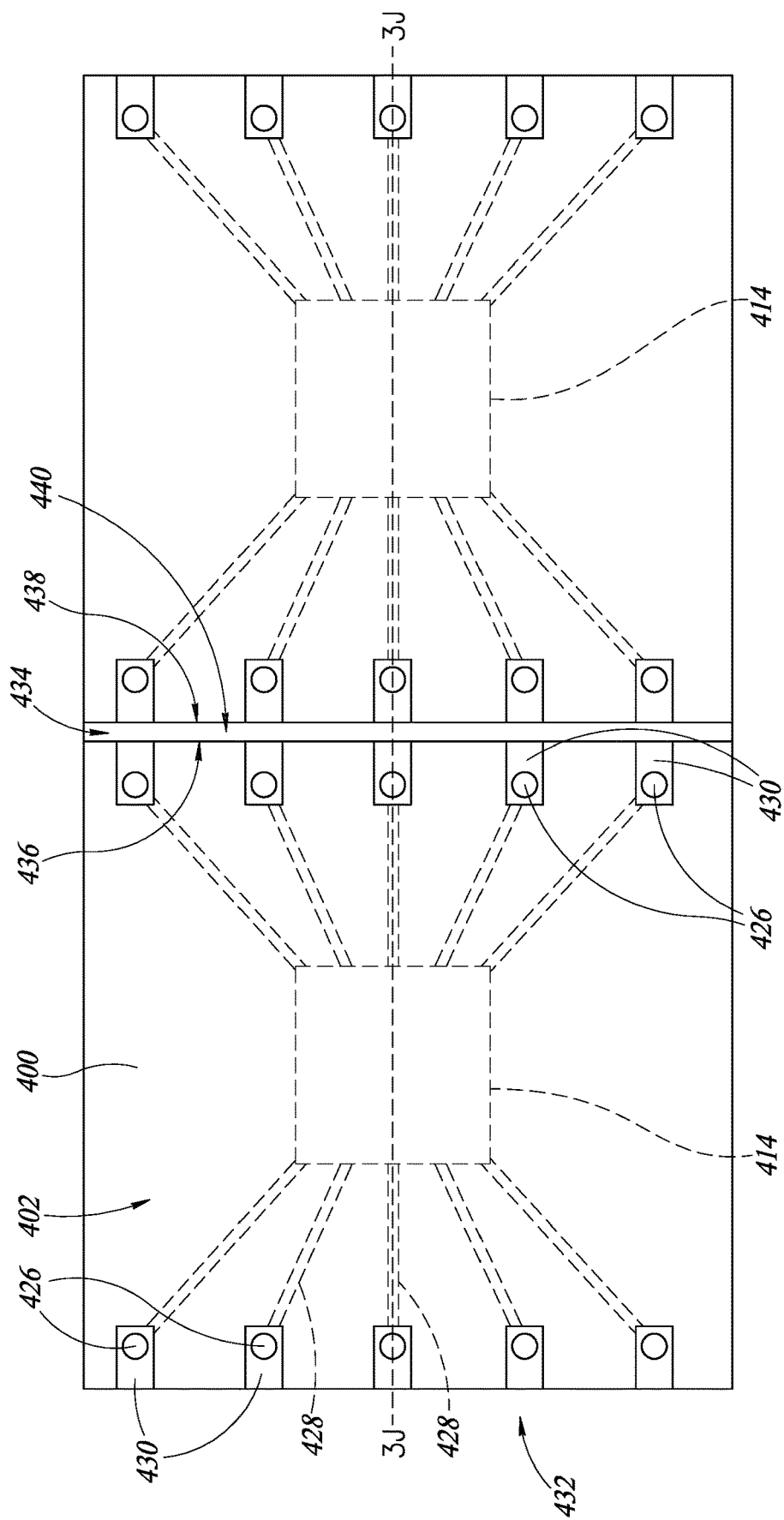
Figure 3I:
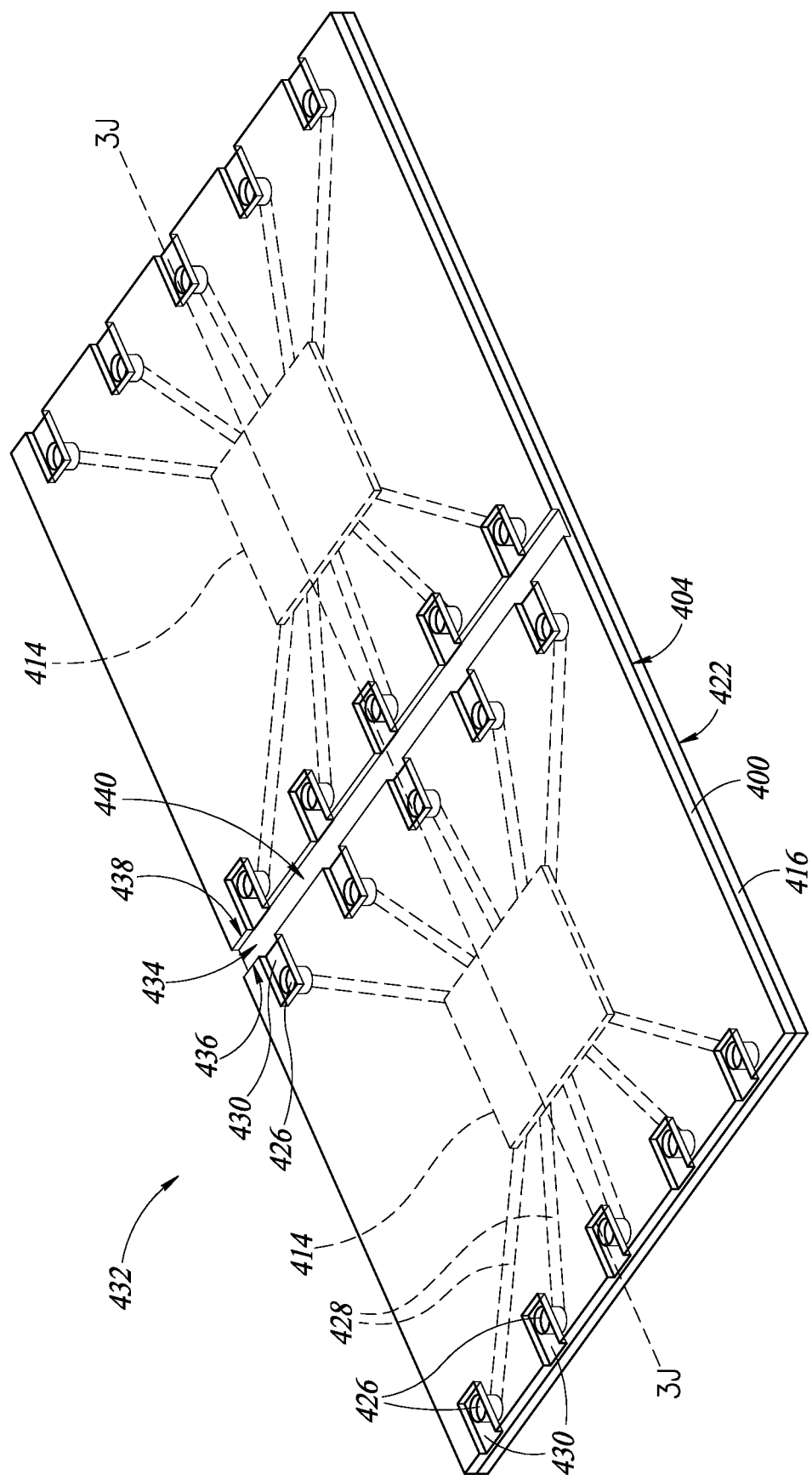
Figure 3J:
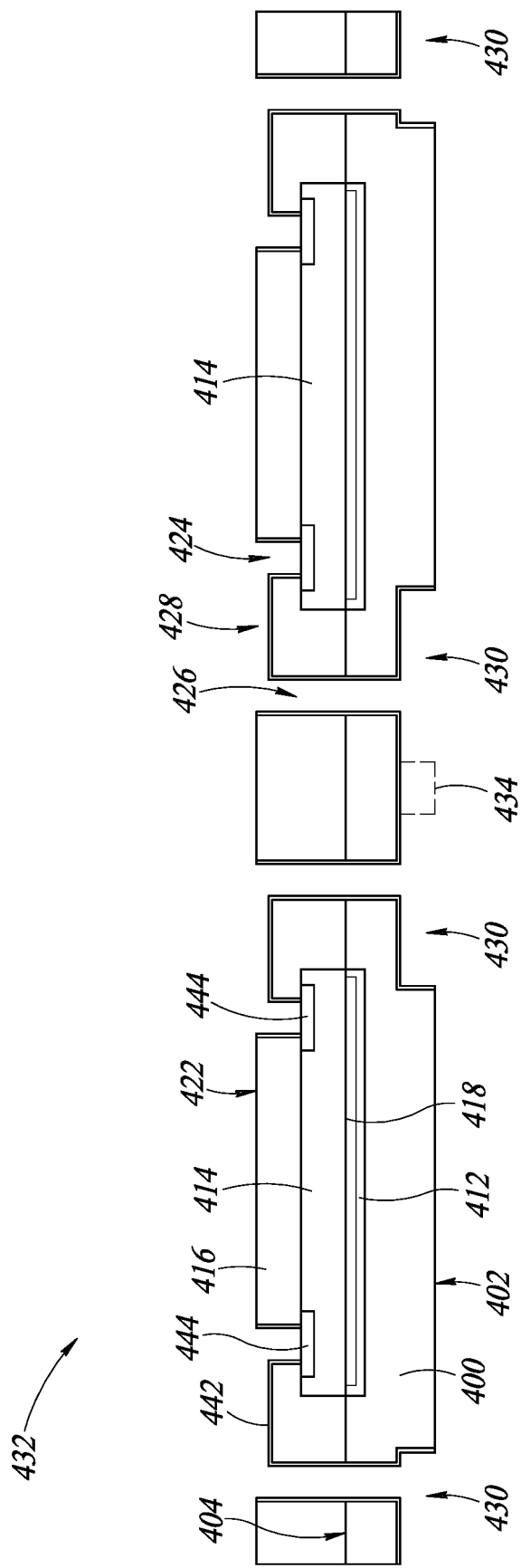
Figure 3K:
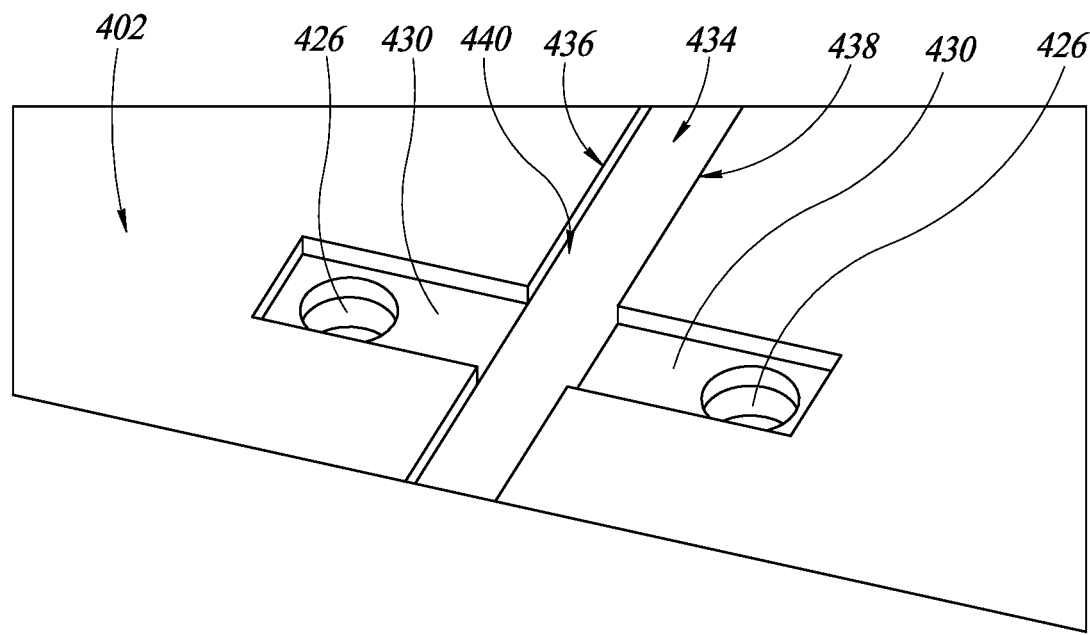
Figure 3L:
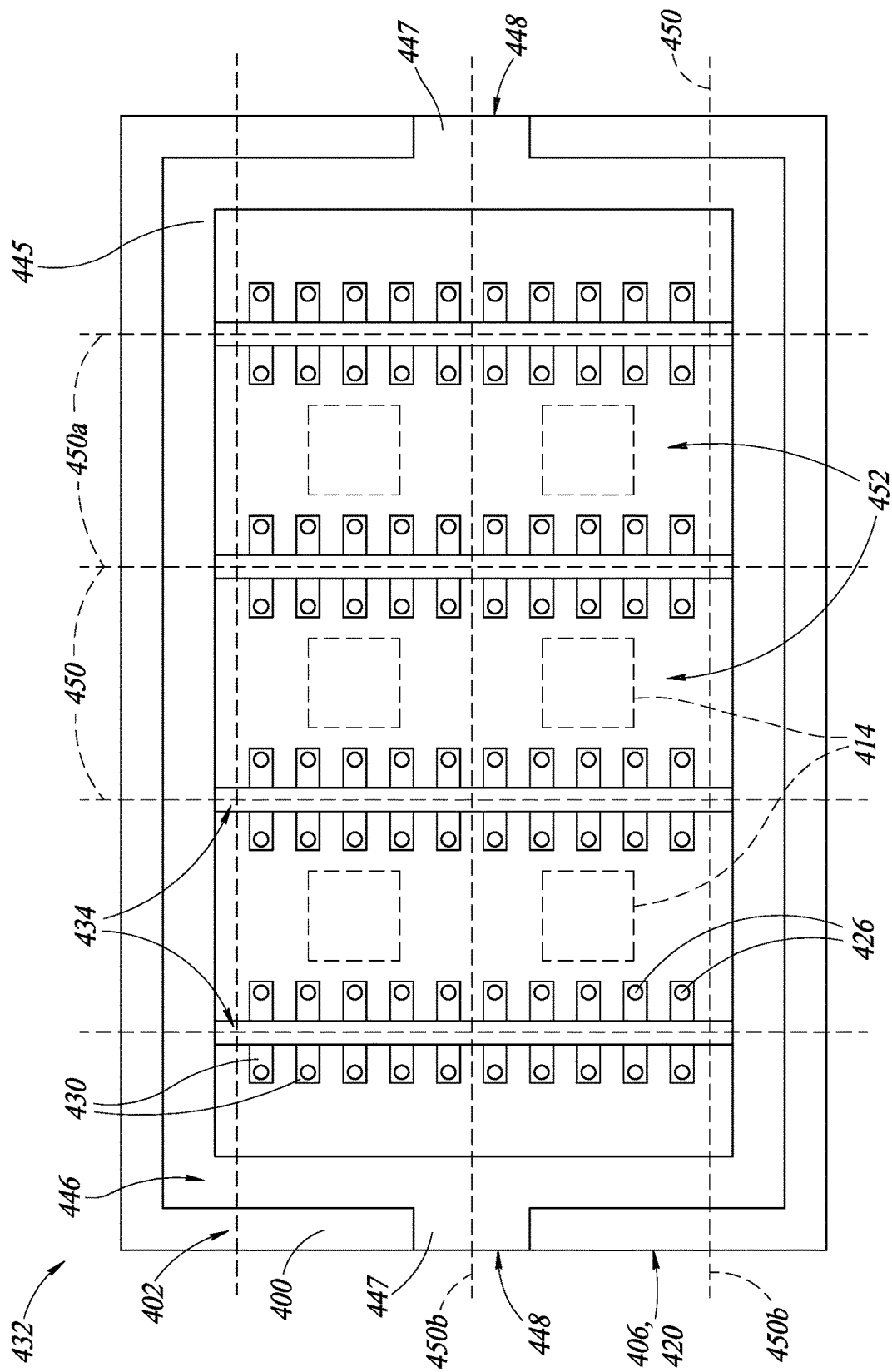
Figure 3M:
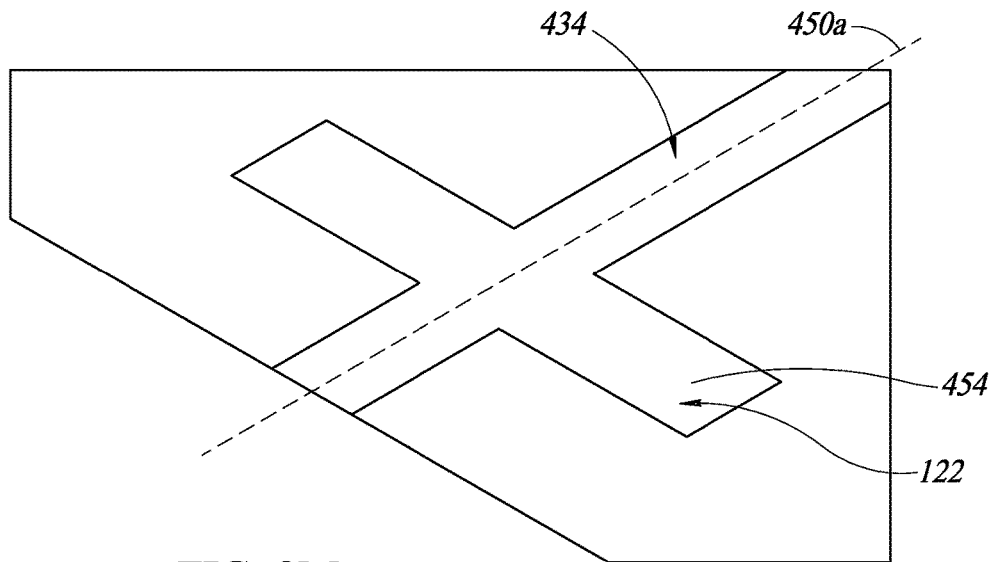
Figure 3N:
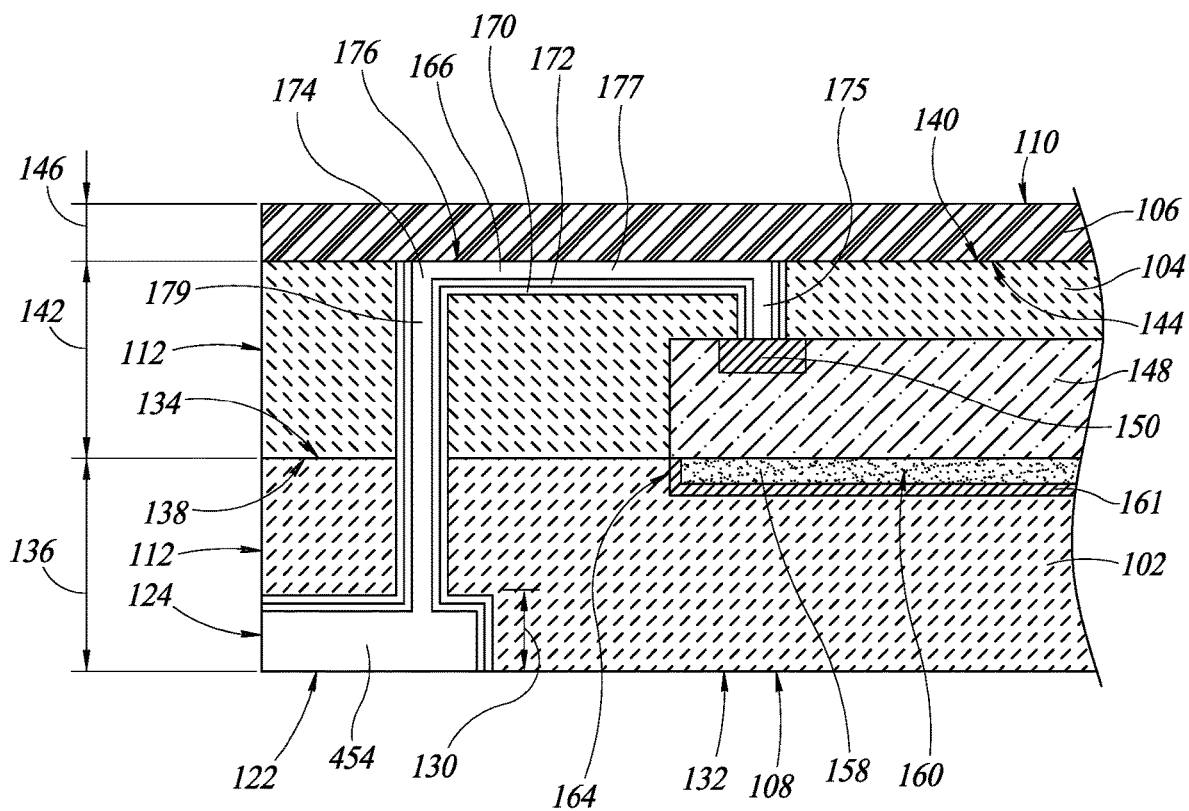

FIGS. 3A-3N are directed to a method of manufacturing the embodiment of the semiconductor package 100 as shown in FIGS. 1A-1F. FIGS. 3A-3N are steps in the method of manufacturing the embodiment of the semiconductor package 100 as shown in FIGS. 1A-1F.

FIG. 3A is directed to a perspective view of a wafer 400, which is made of a first LDS compatible resin doped with or including a first additive material. The wafer 400 may be referred to as a resin wafer, a LDS resin wafer, or some other type of wafer made of a material compatible with an LDS process. FIG. 3B is a side view of the wafer 400 as shown in FIG. 3A. The wafer 400 includes a first surface 402, a second surface 404 opposite to the first surface 402, and a plurality of sidewalls 406 that extend from the first surface 402 to the second surface 404. The sidewalls 406 of the wafer 400 are transverse to the first and second surfaces 402, 404, respectively. The wafer 400 may have been formed by injecting the first LDS resin into a molding tool in which the first LDS resin is allowed to cure and harden to form the wafer 400 out of the first LDS resin. The first LDS resin of the wafer 400 corresponds to the first layer 102 of the semiconductor package 100.

In this embodiment, the wafer 400 is substantially rectangular in shape and when viewed in a top plan. However, in an alternative embodiment, the wafer 400 may be substantially square shape, substantially circular shaped, substantially ovular shaped, or may be some other shape or profile when viewed in the top plan or bottom plan.

A seventh dimension 408 extends from the first surface 402 to the second surface 404 in a direction transverse to the first surface 402 and the second surface 404. The seventh dimension 408 may be substantially equal to the second thickness 136 for the first layer 102 of the semiconductor package 100. The seventh dimension 408 may range from 0.2-mm to 0.3-mm.

FIG. 3C is directed to a perspective view of the wafer 400 after the second surface 404 of the wafer 400 has been patterned with an array or matrix of recesses 410. FIG. 3D is a cross-sectional view of the wafer 400 taken along line 3D-3D as shown in FIG. 3C. In this embodiment, the array or matrix of recesses 410 is a 5×7 array or matrix. However, in an alternative embodiment, the array or matrix of recesses 410 may be a 3×3, a 4×4, a 8×7, or some other type of array or matrix of the recesses 410. The recesses 410 correspond to the recess 160 of the semiconductor package 100.

In this embodiment, the recesses 410 are formed by patterning the second surface 404 of the wafer 400 with a laser during an LDS process. For example, the second surface 404 is exposed to the laser by turning the laser on and off in succession forming ones of the recesses 410 in succession. By exposing the second surface 404 to the laser to from the recesses 410, the first additive material of the first LDS resin of the wafer 400 is activated (e.g., the first additive material is converted from a non-conductive state to a conductive state forming conductive layers 412). Activating the first additive material results in forming a plurality of conductive layers 412 on surfaces of the wafer 400 delimiting the plurality of recess 410. In other words, each respective one of the plurality of conductive layers 412 lines a corresponding one of the plurality of recesses 410. At least one of the conductive layers 412 corresponds to the conductive layer 161 of the semiconductor package 100.

The respective surfaces of the wafer 400 delimiting the plurality of recesses 410 are micro-rough surfaces that are formed by exposing the wafer 400 to the laser when patterning the wafer 400 with the recesses 410. In other words, the conductive layers 412 are on, at least partially cover, and extend along these micro-rough surfaces of the wafer 400 delimiting the plurality of recesses 410.

While the conductive layers 412 are shown as continuous layers in FIG. 3D, the conductive layers 412 may be discontinuous along the micro-rough surfaces of the wafer 400 delimiting the recesses 410. For example, the conductive layers 412 may be made of multiple portions of conductive material that only partially cover the respective surfaces of the wafer 400 delimiting respective ones of the plurality of recesses 410.

The recesses 410 extend into the second surface 404 and terminate within the wafer 400 before reaching the first surface 402 of the wafer 400. In other words, the recesses 410 terminate within the wafer 400 between the first surface 402 and the second surface 404. The recesses 410 terminate within the wafer 400 as the laser forming the recesses 410 partially removes portions of the first LDS compatible resin of the wafer 400 but does not remove enough material to cut entirely through the wafer 400 from the second surface 404 to the first surface 402.

In an alternative method of manufacturing, the recesses 410 may be formed utilizing some other technique than exposing the second surface 404 of the wafer 400 to the laser during the LDS process. For example, the recesses 410 may be formed utilizing a photo-resist etching technique, a chemical etching technique, a grinding technique, sawing technique, or some other type of material removal technique to form the plurality of recesses 410. When one of these alternative techniques is utilized to form the recesses 410, the conductive layers 412 may not be formed as the additive material within the first LDS compatible resin is not activated.

FIG. 3E is directed to a cross-sectional view after a plurality of die 414 has been coupled to the wafer 400 and a second LDS resin layer 416 has been formed covering the plurality of die 414 on the wafer 400. Each one of the plurality of die 414 is coupled to the wafer 400 by a corresponding one of a plurality of adhesive portions 418. Each one of the plurality of adhesive portions 418 is present on a corresponding one of the plurality of conductive layers 412 and within a corresponding one of the plurality of recesses 410.

To couple the plurality of die 414 to the wafer 400, the adhesive portions 418 are formed within the plurality of recesses 410. For example, the plurality of adhesive portions 418 may be formed by injecting a glob of adhesive material into each one of the plurality of recesses 410. After the globs of adhesive material is injected into the recesses 410, each one of the plurality of die 414 is then placed onto each one of the globs of adhesive material by a pick and place machine. After the placement of the plurality of die 414 onto the globs of adhesive material, the adhesive material is allowed to cure and harden resulting in the formation of the plurality of adhesive portions 418 and resulting in the plurality of die 414 being coupled to the wafer 400 by the plurality of adhesive portions 418. At least one of the adhesive portions 418 corresponds to the adhesive 158 of the semiconductor package 100 as shown in FIGS. 1A-1F. At least one of the plurality of die 414 corresponds to the die 148 of the semiconductor package 100 as shown in FIGS. 1A-1F.

After the plurality of die 414 is coupled to the wafer 400 by the plurality of adhesive portions 418, the second LDS resin layer 416 is formed on the second surface 404 of the wafer 400 covering the plurality of die 414. The second LDS resin layer 416 is doped with or includes a second additive material. The second additive material of the second LDS resin layer 416 may be the same as the first additive material of the wafer 400. The second LDS resin layer 416 corresponds to the second layer 104 of the semiconductor package 100 as shown in FIGS. 1A-1F.

The second LDS resin layer 416 is formed by placing a molding tool onto the second surface of the wafer 400 and then injecting an LDS resin between the molding tool and the second surface of the wafer 400. The second LDS resin layer 416 is then allowed to cure and hardened at which point the mold tool is removed forming the second LDS resin layer 416 on the second surface 404 of the wafer 400. The second LDS resin layer 416 includes a plurality of sidewalls 420. Each one of the plurality of sidewalls 420 is substantially coplanar and substantially flush with a corresponding one of the plurality of sidewalls 406 of the wafer 400. The second LDS resin layer 416 further includes a surface 422 that faces away from the wafer 400. The surface 422 of the second LDS resin layer 416 corresponds to the second internal surface 140 of the second layer 104 of the semiconductor package 100.

FIGS. 3F-3J are various views of section 3F encircled by the dotted square as shown in FIG. 3E after a plurality of first holes 424, a plurality of second holes 426, a plurality of troughs 428, and a plurality of recesses 430 have been formed in a wafer assembly 432. FIG. 3F is a top plan view and FIG. 3G is a perspective view of FIG. 3F after the plurality of first holes 424, the plurality of second holes 426, the plurality of troughs 428, and the plurality of recesses 430 have been formed in the wafer assembly 432. The first holes 424, the second holes 426, the troughs 428, and the recesses 430 are formed by exposing a laser to the first surface 402 of the wafer 400 and exposing the laser to the surface 422 of the second LDS resin layer 416 utilizing an LDS process.

The laser is exposed to the surface 422 of the second LDS resin layer 416 at selected locations and may be held stationary at each of the selected locations for a selected period of time to form the first holes 424. For example, the laser may be held stationary at a first one of the selected locations for a first selected period of time to form at least one of the first holes 424. After the at least one of the first holes 424 has been formed, the laser may be turned off, moved to a second one of the selected locations, and then turned back on to form at least another one of the first holes 424. This process may be repeated multiple times in a selected manner (e.g., programmed) to form the first holes 424 and the second holes 426. In some embodiments, the first holes 424 may be formed before the second holes 426 and the troughs 428. In some embodiments, a screen patterned with openings may be positioned over the laser such that the laser is directed onto multiple ones of the selected locations to form multiple ones of the first holes 424 and the second holes 426 relatively at the same time.

In some embodiments, the laser may be exposed to multiple locations on the surface 422 at the same time by placing a stencil or pattern over the laser such that the laser is exposed to the multiple locations at the same time forming multiple ones of the plurality of first holes 424 extending into the surface 422 at the same time. In other words, multiple ones of the plurality of first holes 424 are formed at the same time as each other.

The first holes 424 extend into the surface 422 of the second LDS resin layer 416 to corresponding ones of the plurality of die 414. Each one of the first holes 424 is to be aligned with and expose a surface of a respective contact pad of the corresponding one of the plurality of die 414. For example, these respective contact pads 444, which may be seen in FIG. 3J, may be the same or similar to the first and second contact pads 150, 152, respectively, of the die 148 in the semiconductor package 100 as shown in FIG. 1E.

The second holes 426 may be formed in the same or similar fashion as the first holes 424 as discussed above. The second holes 426 extend into the surface 422 of the second LDS resin layer 416 to the first surface 402 of the wafer 400. The first holes 424 have a first depth that is less than a second depth of the second holes 426 as the second holes 426 extend entirely through the wafer 400 and the second LDS resin layer 416. In other words, the second holes 426 extend from the surface 422 of the second LDS resin layer 416 to the first surface 402 of the wafer 400.

In some embodiments, the laser may be exposed to multiple locations on the surface 422 at the same time by placing a stencil or pattern over the laser such that the laser is exposed to the multiple locations at the same time forming multiple ones of the plurality of second holes 426 extending into the surface 422 at the same time. In other words, multiple ones of the plurality of second holes 426 are formed at the same time as each other.

After the first and second holes 424, 426, respectively, are formed, the troughs 428 may be formed by turning on the laser and moving the laser between corresponding ones of the first holes 424 and the second holes 426. Each one of the troughs 428 extends from one of the first holes 424 to a corresponding one of the second holes 426. The troughs 428 may have a third depth less than the first and second depths, respectively, of the first and second holes 424, 426, respectively.

In some embodiments, the laser may be exposed to multiple locations on the surface 422 at the same time by placing a stencil or pattern over the laser such that the laser is exposed to the multiple locations at the same time forming multiple ones of the plurality of troughs 428 extending into the surface 422 at the same time. In other words, multiple ones of the plurality of second holes 426 are formed at the same time as each other.

After the first holes 424, the second holes 426, and the troughs 428 have been formed, the recesses 430 may be formed extending into the first surface 402 of the wafer 400. After the first holes 424, the second holes 426, and the troughs 428 are formed, the wafer assembly 432 as shown in FIG. 3F is flipped by a flip-chip technique such that the laser may be readily exposed to the first surface 402 of the wafer 400. After the wafer assembly 432 has been flipped, the laser is exposed to the first surface 402 of the wafer 400 forming the recesses 430. For example, the laser may be turned on and off successively and moved along the first surface 402 to form the recesses 430. In some embodiments, a screen patterned with openings may be positioned over the laser such that the laser is directed onto multiple ones of the selected locations to form multiple ones of the recesses 430 relatively at the same time.

As may readily be seen in FIG. 3F, the recesses 430 at a central region of the wafer assembly 432 extend between corresponding ones of the second holes 426. The recesses 430 overlap corresponding ones of the plurality of second holes 426.

Utilizing and exposing the laser to the surface 422 of the second LDS resin layer 416 and the first surface 402 of the wafer 400 results in the laser activating the respective additive materials within the wafer 400 and the second LDS resin layer 416. As discussed earlier, the additive materials may be non-conductive metallic compounds that are converted from a non-conductive state to a conductive state when exposed to the laser. For example, when the laser is exposed to the wafer 400 and the second LDS resin layer 416 to form the first holes 424, the second holes 426, the troughs 428, and the recesses 430, the laser removes portions of the wafer 400 and the second LDS resin layer 416, respectively, and activates the additive materials such that conductive layers at least partially covers micro-roughed surfaces of the wafer 400 and the second LDS resin layer 416, respectively. These micro-rough surfaces delimiting the first holes 424, the second holes 426, the troughs 428, and the recesses 430 are lined with the respective conductive layers. For example, a first conductive layer 442 formed by activating the additive material at least partially lines these micro-rough surfaces delimiting the first holes 424, the second holes 426, the troughs 428, and the recesses 430. The conductive layer 442 may readily be seen in FIG. 3J, and the conductive layer 442 corresponds to the first conductive layer 170 and the fourth conductive layer 178 of the semiconductor package 100 as shown in FIG. 1E. As will become apparent in light of the further discussion herein, the first holes 424, the second holes 426, the troughs 428, and the recesses 430 are utilized to form the plurality of leads 114 and the first and second conductive structures 166, 168, respectively, of the semiconductor package 100 as shown in FIG. 1E.

After the wafer assembly 432 has been flipped and the recesses 430 have been formed, a plurality of channels 434 are formed extending into the first surface 402 of the wafer 400. The plurality of channels 434 may be readily seen in FIG. 3L. For the sake of simplicity and brevity of the present disclosure, only details of the channel 434 will be discussed in detail herein with respect to FIG. 3H. However, it will be readily appreciated, that the details of the channel 434 as shown in FIG. 3H will readily apply to the other respective channels 434 of the plurality of channels 434 as shown in FIG. 3L.

FIG. 3H is directed to a bottom plan view of the wafer assembly 432 after the channel 434 has been formed. FIG. 3I is a perspective bottom plan view of the wafer assembly 432 after the channel 434 has been formed.

The channel 434 is formed by exposing the first surface 402 of the wafer 400 to the laser and moving the laser along the first surface 402 of the wafer 400. The channel extends through the recesses 430 and separates the recesses 430 into a first portion and a second portion, which may be halves of the recesses 430 as originally formed in the first surface 402 of the wafer 400. The channel 434 may have a fourth depth substantially equal to a fifth depth of the recesses 430. In alternative embodiments, the fourth depth may be greater than the fifth depth, or the fourth depth may be less than the fifth depth.

Similar to or the same as forming the first holes 424, the second holes 426, the troughs 428, and the recesses 430, forming the channels 434 with the laser activates the additive material such that the conductive layer 442 lines the respective sidewalls and surfaces of the wafer 400 that delimit the channel 434. For example, a first sidewall 436 delimiting the left-hand side of the channel 434 is at least partially covered by the conductive layer 442 and the second sidewall 438 delimiting the right-hand side of the channel 434 is at least partially covered by the conductive layer 442. A bottom surface 440 delimiting a bottom of the channel 434 extends from the first sidewall 436 to the second sidewall 438 and is at least partially covered by the conductive layer 442.

In this embodiment, the channel 434 extends into the first surface 402 of the wafer 400 and terminates before reaching the second LDS resin layer 416. In alternative embodiments, the channel 434 may extend into the first surface of the wafer 400 and may partially extend into the second LDS resin layer 416 such that the channel 434 terminates within the second LDS resin layer 416 before reaching the surface 422 of the second LDS resin layer 416.

FIG. 3J is a cross-sectional view taken along line 3J-3J as shown in FIGS. 3H and 3I. FIG. 3K is bottom plan enlarged perspective view of one of the recesses 430 at a central region of the cross-sectional view of the wafer assembly 432 as shown in FIG. 3J. As discussed earlier and as shown in FIG. 3J, the conductive layer 442 lines the first holes 424, the second holes 426, the troughs 428, and the recesses 430. While not shown, the first sidewall 436, the second sidewall 438, and the bottom surface 440 are lined by the conductive layer 442 as similar to the first holes 424, the second holes 426, the troughs 428, and the recesses 430, the channels 434 were formed utilizing the laser activating the additive material within the second LDS resin layer 416.

FIG. 3L is directed to a simplified version of the wafer 400 including only six of the recesses 410 and six of the die 414 such that there is a 3×2 array or matrix of die 414 on the wafer 400. After the channels 434 have been formed, a boundary trough or recess 446 is formed extending into the first surface 402 of the wafer 400. The boundary trough 446 surrounds the plurality of recesses 430 and the plurality of channels 434. The boundary trough 446 is formed utilizing the laser by exposing the laser to the first surface 402 of the wafer 400. The laser activates the first additive material within the wafer 400 such that the boundary trough 446 is lined by the conductive layer 442 (e.g., sidewalls and a bottom surface delimiting the boundary trough are lined with the conductive layer 442). The surfaces and sidewalls of the wafer 400 delimiting the boundary trough 446 formed by the laser may be micro-rough surfaces and sidewalls that are partially covered by the conductive layer 442.

The boundary trough 446 includes a boundary portion 445 and end portions 447 that have ends 448 that are at the respective sidewalls 406, 420 of the wafer 400 and the second LDS resin layer 416, respectively. The ends 448 are substantially coplanar and substantially flush with the respective sidewalls 406, 420 of the wafer 400 and the second LDS resin layer 416, respectively. The boundary portion 445 is spaced inward from the respective sidewalls 406, 420 of the wafer 400, and the boundary portion 445 is around the channels 434 and the recesses 430. The channels 434 extend to and from opposite sides of the boundary portion 445. For example, first ends of the channels 434 are at bottom side of the boundary portion 445 and second ends of the channels 434 opposite to the first ends of the channels 434 are at the top side of the boundary portion 445 based on the orientation of the wafer assembly 432 as shown in FIG. 3L. The boundary trough 446 may have a sixth depth substantially equal to the first depth of the recesses 430. However, in alternative embodiments, the sixth depth may be less than the first depth of the recesses 430, or the sixth depth may be greater than the first depth of the recesses 430.

A plurality of saw lines or kerf lines 450 includes first saw lines 450a that extend along corresponding ones of the plurality of channels 434, and second saw line 450b that extends across the plurality of channels 434. The second saw lines 450b are transverse to the first saw lines 450a. For example, based on the orientation of the wafer assembly 432 as shown in FIG. 3L, the first saw lines 450a extend in a first direction (e.g., vertical direction) and the second saw lines 450b extend in a second direction (e.g., horizontal direction) transverse to the first direction. In this embodiment, the first saw lines 450a are perpendicular to the second saw lines 450b. The plurality of saw lines 450 define regions 452 of which the wafer assembly 432 will be singulated along to form individual ones of the semiconductor packages 100 as shown in FIGS. 1A-1E. The singulation process may be carried out by a saw tool, a cutting tool, or some other type of tool suitable for singulating the wafer assembly 432 into individual ones of the semiconductor packages 100.

After the boundary trough 446 has been formed, a first plating step is carried out forming a second conductive layer on the first conductive layer 442 lining the first holes 424, the second holes 426, the troughs 428, the channels 434, and the boundary trough 446. The first plating step may be a chemical plating step in which the second conductive layer is grown on the first conductive layer 442 such that the second conductive layer plates the first conductive layer 442. The chemical plating step may include placing the wafer assembly 432 into a chemical bath to plate the first conductive layer with the second conductive layer. Plating the first conductive layer with the second conductive layer partially fills the first holes 424, the second holes 426, the troughs 428, the channels 434, and the boundary trough 446 with the second conductive layer, which is on and covers the first conductive layer 442. The second conductive layer (not shown) corresponds to the second conductive layer 172 and the fifth conductive layer 180 of the semiconductor package 100 as shown in FIG. 1E.

After the second conductive layer is formed on and covers the first conductive layer 442, the first holes 424, the second holes 426, the troughs 428, the recesses 430, and the boundary trough 446 are partially filled with the first and second conductive layers. The first conductive layer 442 and the second conductive layer extend along the first holes 424, the second holes 426, the troughs 428, the recesses 430 and the boundary trough 446. The first conductive layer 442 and the second conductive layer line respective surfaces and sidewalls of the wafer 400 and the second LDS resin layer 416 that delimit the first holes 424, the second holes 426, the troughs 428, the recesses 430, and the boundary trough 446, respectively.

After the second conductive layer is formed, a second plating step is carried out, which is an electrolytic plating process. As the first and second conductive layers extend along all of the first holes 424, the second holes 426, the troughs 428, the recesses 430, and the boundary recess 446, electrical components (not shown) may be coupled to portions of the first and second conductive layers at the end portions 447 of the boundary trough 446. For example, these electrical components (not shown) pass an electrical current through the first conductive layer 442 and the second conductive layer lining the first holes 424, the second holes 426, the troughs 428, the recesses 430, and the boundary trough 446. The wafer assembly 432 may be placed within an electrolytic plating bath and an electrical current may then be passed through the first conductive layer 442 and second conductive layer utilizing the electronic components such that a conductive material within the electrolytic plating bath is attracted to the first conductive layer 442 and the second conductive layer. The conductive material attracted to the first conductive layer 442 and the second conductive layer fill the first holes 424, the second holes 426, the troughs 428, the recesses 430, and the channels 434 with a conductive material 454, which includes the first conductive layer 442, the second conductive layer (not shown), and a third conductive layer. The first conductive layer 442 corresponds to the first and fourth conductive layers 170, 178, the second conductive layer corresponds to second and fifth conductive layers 172, 180, and the third conductive layer corresponds to the third and sixth conductive layers 174, 182. The first conductive layer 442, the second conductive layer, and the third conductive layer are in a stacked configuration. The conductive material 454 corresponds to the conductive layers 170, 172, 174, 178, 180, 182 of the semiconductor package 100 as shown in FIG. 1E. The conductive material 454 may be readily seen in FIG. 3M. While the conductive material 454 appears to be made of a single layer as shown in FIG. 3M, the conductive material 454 is made of multiple layers of conductive material corresponding to the respective conductive layers 170, 172, 174, 178, 180, 182 of the semiconductor package 100 as shown FIG. 1E.

After forming the third conductive layer, the first holes 424, the second holes 426, the troughs 428, the recesses 430, and the boundary recess 446 are filled with the first conductive layer 442, the second conductive layer (not shown), and the third conductive layer 454, respectively. After forming these respective conductive layers, the wafer assembly 432 is singulated along the plurality of saw lines 450 forming individual ones of the semiconductor package 100 as shown in FIG. 1E.

FIG. 3N is a cross-sectional view of one of the first electrical conductive structures 166 of the semiconductor package 100 after singulation along the saw lines or kerf lines 450 as shown in FIG. 3L. Singulating along the first saw lines 450a removes all of the conductive material 454 within the channels 434 such that no conductive material is present on and along ones of the plurality of first sidewalls 112 of the semiconductor packages 100. For example, the singulation tool may make a cut that is slightly wider than the channels 434 to remove all of the conductive material 454 within the channels 434 to reduce the likelihood of adjacent ones of the plurality of leads 114 being short circuited together by conductive material that remains on the plurality of first sidewalls 112.

Figure 4:
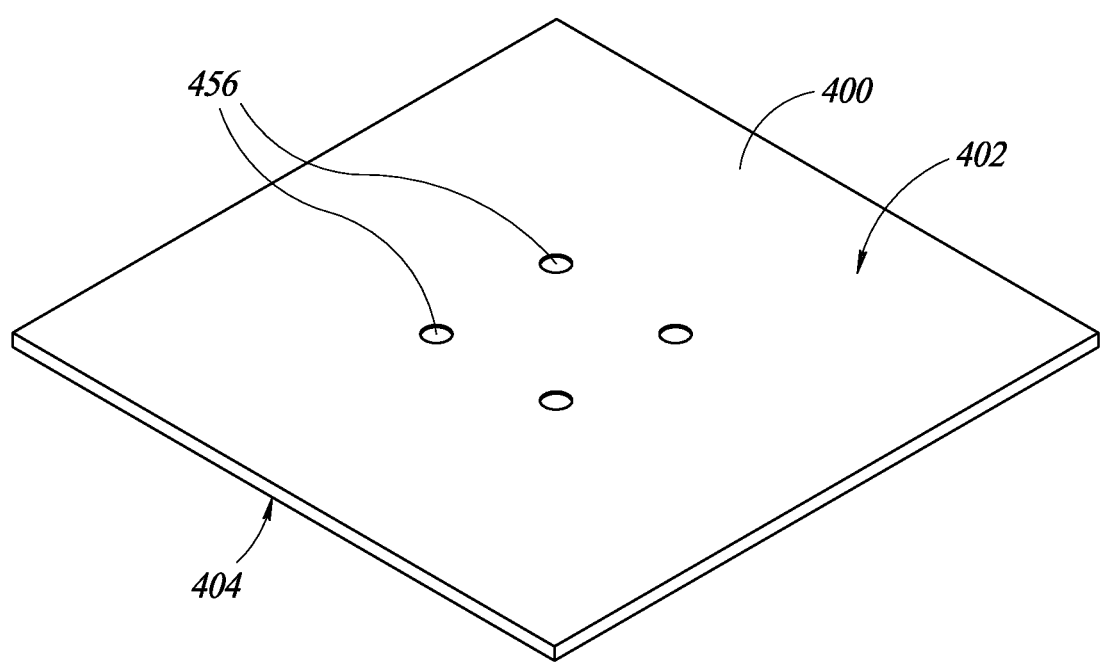
FIG. 4 illustrates an alternative embodiment of a method of manufacturing yet another alternative embodiment of a leadframe-less semiconductor package of the present disclosure.

FIG. 4 is directed to an alternative embodiment of the wafer 400 in which a plurality of indentations 456 replace the plurality of recesses 410 in the wafer 400 as shown in FIG. 3C. Similar to the recesses 410 of the wafer 400 as shown in FIG. 3C, the indentations 456 partially receive a glob of adhesive that fills the indentations to strengthen the coupling of the plurality of die 414 to the wafer 400. Similar to the recesses 410, while not shown, a conductive layer lines the indentations 456 when the indentations are formed utilizing a laser. In some embodiments, the indentations 456 are not lined with a conductive layer when another formation technique is utilized other than a laser (e.g., drilling, photoresist etch, etc.). For example, the four indentations 456 as shown in FIG. 4 may replace a corresponding one of the plurality of recesses 410. In other words, each one of the plurality of recesses 410 may be replaced by four corresponding indentations 456 such that each die 414 overlaps four of the indentations 456.

A method may be summarized as including coupling a plurality of die to a first side of a resin wafer that includes a first additive material; forming a resin layer that includes a second additive material on the first side of the resin wafer covering the plurality of die with the resin layer; patterning the resin wafer and the resin layer with a laser including: forming a plurality of first openings extending through the resin layer to ones of the plurality of die; forming a plurality of second openings extending through the resin layer and through the resin wafer to a second side of the resin wafer opposite to the first side; forming a plurality of first recesses extending into the resin layer extending from corresponding ones of the plurality of first openings to corresponding ones of the plurality of second openings; forming a plurality of second recesses extending into the second side of the resin wafer overlapping corresponding ones of the plurality of second openings; forming a boundary recess extending into the second side of the resin wafer surrounding the plurality of second recesses; and forming a plurality of channels extending between corresponding ones of the second recesses and extending to the boundary recesses; forming a first layer of conductive material in the pluralities of first openings, second openings, first recesses, second recesses, and channels, respectively, and in the boundary recess; forming a second layer of conductive material on the first layer of conductive material; and forming a plurality of packages including singulating the resin wafer and the resin layer.

Forming the plurality of first openings may include activating the second additive material along the plurality of first openings; forming the plurality of second openings may include activating the first and second additive materials along the plurality of second openings; forming the plurality of first recesses may include activating the second additive material along the plurality of first recesses; forming the plurality of second recesses may include activating the first additive material along the plurality of second recesses; forming the boundary recess may include activating the first additive material along the boundary recess; and forming the plurality of channels may include activating the first additive material along the plurality of channels.

Forming the first layer of conductive material may include performing an electroless plating coupling the first layer of conductive material to the first and second additive materials activated along the pluralities of first openings, second openings, first recesses, second recesses, and channels, respectively, and the boundary recess.

Forming the second layer of conductive material may include performing an electroplating coupling the second layer of conductive material to the first layer of conductive material.

The method may further include forming the plurality of second recesses extending into the second side of the resin wafer includes forming the plurality of second recesses having a depth less than a thickness of the resin wafer extending from the first side of the resin wafer to the second side of the resin wafer.

Singulating the resin wafer and the resin layer may include singulating along a first kerf line spaced inwardly from the boundary recess; and singulating along second kerf lines extending along the plurality of channels.

Forming the plurality of packages may further include forming an encapsulant on the resin layer covering the resin layer and respective surfaces of the second layer of conductive material exposed from the resin layer.

Singulating the resin wafer and the resin layer may further include singulating the encapsulant; and forming respective sidewalls of the resin wafer, the first conductive layer, the encapsulant, and the second conductive layer substantially coplanar with each other.

The method may further include forming a plurality of die recesses in the first side of the resin wafer, and wherein coupling the plurality of die to the first side of the resin wafer further includes: forming an adhesive in the plurality of die recesses; and disposing each respective one of the plurality of die on the adhesive in a corresponding one of the plurality of die recesses.

A method may be summarized as including coupling a plurality of die to a first side of a resin wafer that includes a first additive material; exposing a second side of the resin wafer opposite to the first side to a laser including: forming a boundary recess extending into the second side of the resin wafer activating the first additive material along and within the boundary recess; forming a plurality of recesses extending into the second side of the resin wafer surrounded by the boundary recess and activating the first additive material along and within the recesses; and forming a plurality of channels extending in a first direction extending across corresponding ones of the plurality of recesses and extending from a first portion of the boundary recess extending in a second direction transverse to the first direction to a second portion of the boundary recess extending in the second direction, forming the plurality of channels including activating the first additive material along and within the plurality of channels; and forming a first conductive layer in the boundary recess, the plurality of channels, and the plurality of recesses extending continuously along the plurality of channels and the boundary recess.

The method may further include forming a resin layer that includes a second additive material on the first side of the resin wafer covering the plurality of die; exposing the resin wafer and the resin layer to the laser forming a plurality of first openings extending through the resin layer and through the resin wafer to the second side of the resin wafer activating the first and second additive material within and along the plurality of first openings; exposing the resin layer to the laser forming a plurality of second openings extending into the resin layer to corresponding ones of the plurality of die activating the second additive material along and within the plurality of second openings; and exposing the resin layer to the laser forming a plurality of troughs extending into the resin layer and extending from corresponding ones of the pluralities of first and second openings activating the second additive material along and within the plurality of troughs.

Forming the first conductive layer may further include forming the first conductive layer in the plurality of first openings, the plurality of second openings, and the plurality of troughs.

The method may further include forming a second conductive layer on the first conductive layer.

The method may further include forming a plurality of packages including: forming an encapsulant on the resin layer covering the resin layer, the first conductive layer, and the second conductive layer with the encapsulant; and forming a plurality of packages by singulating the resin wafer, the first conductive layer, the second conductive layer, the resin layer, and the encapsulant along the plurality of channels.

A device may be summarized as including a first layer of resin having a first additive material, the first layer having a first thickness, the first layer having a first surface and a second surface opposite to the first surface; a die on the second surface of the first layer; a second layer of resin having a second additive material on the second surface of the first layer of resin, the second layer covers the die, the second layer having a third surface facing away from the first layer, the second layer having a second thickness extending from the second surface to the third surface; a first lead exposed from the first surface; a first conductive via extending from the first lead to the third surface of the second layer; a second conductive via extending into the third surface to the die; a bus bar extending from the first conductive via to the second conductive via, the bus bar coupling the first conductive via to the second conductive via; and a third layer of resin on the third surface of second layer, the third layer covers respective surfaces of the bus bar, the first conductive via, and the second conductive via, respectively, exposed from the third surface of the second layer, the third layer having a third thickness less than the first thickness and less than the second thickness.

The first layer may have a first sidewall; the second layer may have a second sidewall substantially coplanar with the first sidewall; the third layer may have a third sidewall substantially coplanar with the first and second sidewalls, respectively; and the lead may have a fourth sidewall substantially coplanar with the first, second, and third sidewalls, respectively.

The lead may have a fourth thickness less than the first thickness of the first layer.

The device may further include a recess extends into second surface of the first layer, an adhesive is within the recess, and the die is on the adhesive within the recess.

The device may include a first conductive layer that extends along the first conductive via, the second conductive via, and the bus bar.

The bus bar may include a second conductive layer on the first conductive layer

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a first layer of resin having a first laser activated additive material that becomes conductive when exposed to a laser, the first layer having a first thickness, the first layer having a first surface and a second surface opposite to the first surface, and the first layer has a first sidewall;
a die on the second surface of the first layer;
a second layer of resin having a second laser activated additive material that becomes conductive when exposed to the laser, the second layer of resin is on the second surface of the first layer of resin, the second layer covers the die, the second layer having a third surface facing away from the first layer, the second layer having a second thickness extending from the second surface to the third surface, and the second layer has a second sidewall substantially coplanar with the first sidewall;
a lead exposed from the first surface of the first layer, and the lead has a third sidewall substantially coplanar with the first and second sidewalls, respectively;
a first conductive via extending from the lead to the third surface of the second layer;
a second conductive via extending into the third surface of the second layer to the die;

a bus bar extending from the first conductive via to the second conductive via, the bus bar coupling the first conductive via to the second conductive via; and a third layer of resin on the third surface of the second layer, the third layer covers respective surfaces of the bus bar, the first conductive via, and the second conductive via, respectively, exposed from the third surface of the second layer, the third layer having a third thickness less than the first thickness and less than the second thickness, and the third layer includes a fourth sidewall substantially coplanar with the first, second, and third sidewall, respectively.

2. The device of claim 1, wherein the lead has a fourth thickness less than the first thickness of the first layer.

3. The device of claim 1, further comprising a recess that extends into the second surface of the first layer and an adhesive is within the recess, and wherein the die is on the adhesive within the recess.

4. The device of claim 1, further includes a first conductive layer extends along the first conductive via, the second conductive via, and the bus bar.

5. The device of claim 4, wherein the bus bar includes a second conductive layer on the first conductive layer.

6. A device, comprising:
a first laser activated resin layer contains a first laser activated additive material that is converted from a non-conductive material to a conductive material when exposed to a laser;
a second laser activated resin layer on the first laser activated resin layer, the second laser activated resin layer contains a second laser activated additive material that is converted from a non-conductive material to a conductive material when exposed to the laser;
a recess in the first laser activated resin layer;
a conductive layer within the recess;
an adhesive on the conductive layer within the recess;
a die in the second laser activated resin layer and on the adhesive within the recess, the die including a first contact pad;
a first conductive via coupled to the first contact pad of the die, the first conductive via extending through the first laser activated resin layer and the second laser activated resin layer; and
a first lead in the first laser activated resin layer and exposed from the first laser activated resin layer, the first lead coupled to the first conductive via.

7. The device of claim 6, wherein the adhesive is a die attach film (DAF).

8. The device of claim 6, further comprising a non-conductive layer on the second laser activated resin layer and on a portion of the first conductive via.

9. The device of claim 8, wherein the portion of the first conductive via is exposed from the second laser activated resin layer.

10. The device of claim 6, wherein the die includes a second contact pad and further comprising:
a second conductive via coupled to the second contact pad of the die, the second conductive via extending through the first laser activated resin layer and the second laser activated resin layer.

11. The device of claim 10, further comprising a second lead in the first laser activated resin layer and exposed from the first laser activated layer, the second lead is coupled to the second conductive via.

12. The device of claim 10, further comprising a non-conductive layer on the second laser activated resin layer, the first laser activated resin layer, a portion of the first conductive via, and a portion of the second conductive via.

13. The device of claim 12, wherein the portion of the first conductive via and the portion of the second conductive via are exposed from the second laser activated resin layer.

14. A device, comprising:
a first laser activated resin layer including a plurality of first sidewalls;
a second laser activated resin layer on the first laser activated resin layer, the second laser activated resin layer includes a plurality of second sidewalls coplanar with the plurality of first sidewalls;
a recess in the first laser activated resin layer;
a first laser activated conductive layer within the recess, the first laser activated conductive layer and the recess formed by exposing the first laser activated resin layer to a laser;
an adhesive on the first laser activated conductive layer within the recess;
a die in the second laser activated resin layer and on the adhesive within the recess, the die including a plurality of contact pads and a plurality of sidewalls covered by the second laser activated resin layer;
a plurality of conductive vias coupled to the plurality of contact pads of the die, the plurality of conductive vias extending through the first laser activated resin layer and the second laser activated resin layer, the plurality of conductive vias including a second laser activated conductive layer extending through the first laser activated resin layer and the second laser activated layer formed by exposing the first laser activated resin layer and the second laser activated resin layer to the laser; and
a plurality of leads in the first laser activated resin layer and exposed from the first laser activated resin layer, the plurality of leads coupled to the plurality of conductive vias, the plurality of leads are spaced outward from the plurality of sidewalls of the die and are at the plurality of first sidewalls of the first laser activated resin layer.

15. The device of claim 14, wherein each one of the plurality of leads includes a lead sidewall coplanar with a corresponding first sidewall of the plurality of first sidewalls of the first laser activated resin layer.

16. The device of claim 14, wherein the adhesive is a die attach film (DAF).

17. The device of claim 14, further comprising a non-conductive layer on the second laser activated resin layer and on portions of the plurality of conductive vias.

18. The device of claim 17, wherein the non-conductive layer includes a plurality of third sidewalls coplanar with the plurality of first sidewalls of the first laser activated resin layer and the plurality of second sidewalls of the second laser activated resin layer.

19. The device of claim 17, wherein the portions of the plurality of conductive vias are exposed from the second laser activated resin layer.

* * * * *